United States Patent
Hsieh

(10) Patent No.: US 10,957,731 B1
(45) Date of Patent: Mar. 23, 2021

(54) SENSOR DEVICE AND METHOD FOR MANUFACTURING THE SAME

(71) Applicant: VisEra Technologies Company Limited, Hsin-Chu (TW)

(72) Inventor: Hsin-Yi Hsieh, Taoyuan (TW)

(73) Assignee: Visera Technologies Company Limited, Hsin-Chu (TW)

( * ) Notice: Subject to any disclaimer, the term of this patent is extended or adjusted under 35 U.S.C. 154(b) by 0 days.

(21) Appl. No.: 16/593,417

(22) Filed: Oct. 4, 2019

(51) Int. Cl.
*H01L 27/146* (2006.01)

(52) U.S. Cl.
CPC .. *H01L 27/14629* (2013.01); *H01L 27/14621* (2013.01); *H01L 27/14627* (2013.01); *H01L 27/14645* (2013.01); *H01L 27/14689* (2013.01)

(58) Field of Classification Search
CPC ........ G01N 2021/9583; G01N 21/6486; H01L 27/14627; H01L 27/14689
See application file for complete search history.

(56) References Cited

U.S. PATENT DOCUMENTS

| | | |
|---|---|---|
| 6,287,871 B1 | 9/2001 | Herron et al. |
| 2002/0179835 A1 | 12/2002 | Feygin |
| 2010/0108865 A1 | 5/2010 | Cho et al. |
| 2010/0204064 A1 | 8/2010 | Cho |
| 2012/0061587 A1 | 3/2012 | Wu et al. |
| 2014/0295577 A1 | 10/2014 | Matsuzawa et al. |
| 2015/0141267 A1 | 5/2015 | Rothberg et al. |
| 2017/0023731 A1 | 1/2017 | Gray et al. |
| 2017/0227465 A1 | 10/2017 | Hsieh et al. |
| 2018/0155782 A1* | 6/2018 | Zhong ................ H01L 27/1464 |

FOREIGN PATENT DOCUMENTS

| | | |
|---|---|---|
| JP | 2013-004938 A | 1/2013 |
| WO | WO2013/140707 A1 | 9/2013 |

OTHER PUBLICATIONS

European Search Report dated May 15, 2020 in EP Application No. 19212012.9.
Japanese Office Action with search report cited in corresponding JP application No. 2020-040779 received Dec. 22, 2020, 7 pages.

* cited by examiner

*Primary Examiner* — Changhyun Yi
(74) *Attorney, Agent, or Firm* — Muncy, Geissler, Olds & Lowe, P.C.

(57) ABSTRACT

A sensor device is provided. The sensor device includes at least one sensor unit. The sensor unit includes at least one sensor element, an interlayer, a passivation layer, a micro-lens structure, an opening, and a first reflecting layer. The interlayer is disposed on the sensor element. The passivation layer is disposed on the interlayer. The micro-lens structure is disposed on the passivation layer. The opening is disposed in the micro-lens structure. The first reflecting layer is disposed on the micro-lens structure. In addition, the first reflecting layer extends from the opening to the passivation layer.

20 Claims, 25 Drawing Sheets

SENSOR DEVICE AND METHOD FOR MANUFACTURING THE SAME

BACKGROUND

Technical Field

The present disclosure relates to a sensor device and a method for manufacturing the sensor device, and in particular, it relates to an optical sensor device that may improve light collection efficiency for bio-sensing.

Description of the Related Art

Complementary metal-oxide-semiconductor (CMOS) image sensors have been widely used in electronic devices, including digital cameras, medical imaging equipment, spectrometers, radar devices, and so on. CMOS image sensors usually include integrated circuits and photodiodes and therefore they may capture light and convert it into electrical signals.

Recently, CMOS image sensors also have been used for biological or chemical analysis. For such analysis, a biological or biochemical sample may be placed on a photodiode, and light emitted by the biological or biochemical sample may be directed to the photodiode. The fluorescence or chemiluminescence of the sample may be detected by the photodiode, and spectrum distribution and intensity of the fluorescence or chemiluminescence may be determined. The spectrum and intensity may be used to identify the interaction or properties of the biological or biochemical sample.

Although existing CMOS image sensors have been adequate for their intended purposes, they have not been entirely satisfactory in all respects. For example, the emission light collection efficiency of a biological reaction to the photodiode is low (e.g., lower than 50%) since the light emitted in the opposite direction from the photodiode may not be detected. Therefore, there are still some problems with CMOS image sensors that remain to be solved.

SUMMARY

In accordance with some embodiments of the present disclosure, a sensor device is provided. The sensor device includes at least one sensor unit. The sensor unit includes at least one sensor element, an interlayer, a passivation layer, a micro-lens structure, an opening, and a first reflecting layer. The interlayer is disposed on the sensor element. The passivation layer is disposed on the interlayer. The micro-lens structure is disposed on the passivation layer. The opening is disposed in the micro-lens structure. The first reflecting layer is disposed on the micro-lens structure. In addition, the first reflecting layer extends from the opening to the passivation layer.

In accordance with some embodiments of the present disclosure, a method for manufacturing a sensor device is provided. The method includes the following steps: providing a substrate including at least one sensor element; forming an interlayer on the sensor element; forming a passivation layer on the interlayer; forming a micro-lens structure on the passivation layer; conformally forming a first reflecting layer on the micro-lens structure; and removing a portion of the first reflecting layer and a portion of the micro-lens structure, and forming an opening in the micro-lens structure. In addition, after the opening is formed in the micro-lens structure, the first reflecting layer extends from the opening to the passivation layer.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
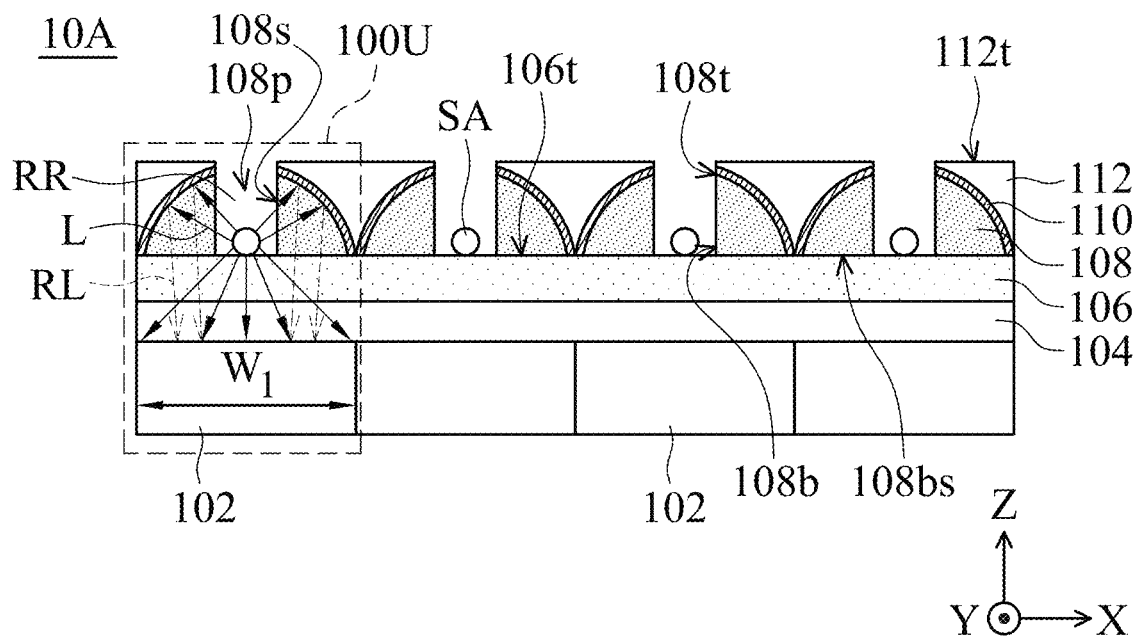
FIG. 1 is a cross-sectional diagram of a sensor device in accordance with some embodiments of the present disclosure.

The sensor device and the method for manufacturing the sensor device of the present disclosure are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the concept of the present disclosure may be embodied in various forms without being limited to those exemplary embodiments.

In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. It should be understood that this description of the exemplary embodiments is intended to be read in connection with the accompanying drawings, which are to be considered part of the entire written description. The drawings are not drawn to scale. In addition, structures and devices are shown schematically in order to simplify the drawing.

In addition, the expressions "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section. Thus, a first element, component, region, layer, portion or section discussed below could be termed a second element, component, region, layer, portion or section without departing from the teachings of the present disclosure.

The terms "about" and "substantially" typically mean+/−10% of the stated value, more typically mean+/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with some embodiments of the present disclosure, the sensor device may include a reflecting layer that is disposed above the micro-lens structure. The reflecting layer may reflect the light that is emitted in the opposite direction from the photodiode and therefore may increase the emission light collection efficiency of the photodiode. The abovementioned emission light in the opposite direction from the photodiode may also include multiple reflective lights, e.g., the emission light first reflected by the second reflecting layer, and then reflected by the first reflecting layer, and finally toward the photodiode. Accordingly, the sensitivity and performance of the sensor device may be improved.

FIG. 1 is a cross-sectional diagram of a sensor device 10A in accordance with some embodiments of the present disclosure. It should be understood that some of the components of the sensor device 10A such as the circuit layer may be omitted in FIG. 1 for clarity. In addition, it should be understood that additional features may be added to the sensor device 10A in accordance with some embodiments of the present disclosure.

In accordance with embodiments of the present disclosure, the sensor device 10A may be not limited to a particular use. In accordance with some embodiments, the sensor device 10A may be used for biological or biochemical analysis. For example, the sensor device 10A may be used to measure or analyze fluorescence or chemiluminescence emitted by a sample SA. In some embodiments, the sample SA may include, but is not limited to, biomolecules, chemical molecules, or a combination thereof. In some embodiments, the nucleic acids may include, but is not limited to, DNA, RNA, proteins, or a combination thereof. In accordance with some embodiments, the sample SA may be analyzed to determine a gene sequence, DNA-DNA hybridization, single nucleotide polymorphisms, protein interactions, peptide interactions, antigen-antibody interactions, glucose monitoring, cholesterol monitoring, and the like.

Referring to FIG. 1, the sensor device 10A may include at least one sensor unit 100U. In some embodiments, the sensor device 10A may include a plurality of sensor units 100U, and the sensor units 100U may be arranged adjacent to each other. In some embodiments, the sensor units 100U may be arranged to form a sensor array.

In accordance with some embodiments, the sensor unit 100U may include at least one sensor element 102. In some embodiments, the sensor element 102 may include a plurality of sensor elements. In some embodiments, the sensor elements 102 may be arranged in a rectangular array or a hexagonal array, but it is not limited thereto. In some embodiments, the sensor element 102 may be a photodiode, or another suitable light sensing component that can convert measured light into current. Specifically, in accordance with some embodiments, the sensor element 102 may include a source and a drain of a metal-oxide-semiconductor (MOS) transistor (not illustrated) that may transfer the current to another components, such as another MOS transistor. The another component may include, but is not limited to, a reset transistor, a current source follower or a row selector for transforming the current into digital signals.

In addition, the sensor element 102 may be configured in a substrate (not illustrated) in accordance with some embodiments. In some embodiments, the substrate may further include a circuit layer (not illustrated) disposed therein. In some embodiments, the sensor element 102 (e.g., the photodiode) may be electrically connected to the circuit layer so as to transfer digital signals to external connections, for example, the circuit layer may be electrically connected to an external signal processor. In some embodiments, the material of the substrate may include, but is not limited to, silicon, III-V group on silicon, graphene-on-silicon, silicon-on-insulator, or a combination thereof. In addition, the circuit layer may be formed of any suitable conductive material.

In accordance with some embodiments, the sensor element 102 may include a front side illumination (FSI) complementary metal-oxide-semiconductor (CMOS), a back side illumination (BSI) complementary metal-oxide-semiconductor (CMOS), or a combination thereof. Specifically, in the embodiments where the sensor element 102 is a FSI CMOS, the circuit layer may be disposed above the sensor element 102. In the embodiments where the sensor element 102 is a BSI CMOS, the circuit layer may be disposed below the sensor element 102.

In accordance with some embodiments, the size of the sensor element 102 may be in a range from about 0.1 μm to about 100 μm, or from about 0.5 μm to about 20 μm. More specifically, in some embodiments, the width $W_1$ of the sensor element 102 in a cross-sectional view may be in a range from about 0.1 μm to about 100 μm, or from about 0.5 μm to about 20 μm in a cross-sectional view.

Referring to FIG. 1, the sensor unit 100U may include an interlayer 104 disposed on the sensor element 102 in accordance with some embodiments. In some embodiments, the interlayer 104 may include a filter, a passivation material, or a combination thereof. Specifically, in accordance with some embodiments, the interlayer 104 may include one or more uniform (continuous) filters, pixelated filters, rejection filters or a combination thereof. The pixelated filter may refer to separated color filters disposed corresponding to different sensor elements 102. In some embodiments, each sensor element 102 may refer to a pixel, but it is not limited thereto. In some embodiments, one or more pixel may correspond to a sensor element 102.

In some embodiments, the uniform (continuous) filter, pixelated filter, or rejection filter may be a single-layered filter, or a multi-layered filter. In some embodiments, the filter may further include an absorption filter, an interference filter, a plasmonic metasurface structure, a dielectric metasurface structure, or a combination thereof. For example, in some embodiments, the pixelated filter may include the combination of absorption filter/absorption filter, interference filter/interference filter, interference filter/absorption filter, plasmonic metasurface structure/dielectric metasurface structure, or any other suitable combination. In some embodiments, the pixelated filter may be used in combination with the rejection filter. The rejection film may exclude the light in a specific wavelength range from passing through it.

In addition, the uniform filter or the pixelated filter may allow the light in a specific wavelength range passing through it. In some embodiments, the material of the filter described above may include, but is not limited to, a pigment-based polymer, a pigment-based dye, a dye-based polymer, a resin or another organic based material, or a combination thereof. In some embodiments, the filter may be made of a red color filter, a green color filter, a blue color filter, a cyan color filter, a magenta color filter, a yellow color filter, or an infrared (IR) pass filter according to needs, but the present disclosure is not limited thereto. In some embodiments, the pixelated filters corresponding to different sensor elements 102 may be filters of a single color or different colors.

As described above, the interlayer 104 may include a passivation material in accordance with some embodiments. In some embodiments, the passivation material may include, but is not limited to, metal oxides, metal nitrides, silicon oxides, silicon nitrides or a combination thereof. In some embodiments, the metal oxides, metal nitrides, silicon oxides, or silicon nitrides may include, but are not limited to, silicon oxide (e.g., $SiO_2$), titanium oxide (e.g., $TiO_2$), tantalum oxide (e.g., $Ta_2O_5$), aluminum oxide (e.g., $Al_2O_3$), niobium oxide (e.g., $Nb_2O_5$), silicon nitride (e.g., $Si_3N_4$), titanium nitride, tantalum nitride, or a combination thereof. In accordance with some embodiments, the passivation material may be transparent or semi-transparent.

As shown in FIG. 1, the sensor unit 100U may include a passivation layer 106 disposed on the interlayer 104. The interlayer 104 may be disposed between the sensor element 102 and the passivation layer 106. The passivation layer 106 may protect the interlayer 104 and sensor element 102 from delamination, corrosion, or damage. Specifically, the passivation layer 106 may prevent the solution of the sample SA from contacting the interlayer 104 or the sensor element 102. In addition, the passivation layer 106 may be coated or treated with self-assembly monolayers (SAMs), functional polymers, or hydrogels for sample SA immobilization.

In some embodiments, the material of the passivation layer 106 may include, but is not limited to, metal oxides, metal nitrides, silicon oxides, silicon nitrides, or a combination thereof. In some embodiments, the metal oxides, metal nitrides, silicon oxides, silicon nitrides may include, but are not limited to, silicon oxide (e.g., $SiO_2$), titanium oxide (e.g., $TiO_2$), tantalum oxide (e.g., $Ta_2O_5$), aluminum oxide (e.g., $Al_2O_3$), niobium oxide (e.g., $Nb_2O_5$), silicon nitride (e.g., $Si_3N_4$), titanium nitride, tantalum nitride, or a combination thereof. In accordance with some embodiments, the passivation layer 106 may be transparent or semi-transparent.

In addition, as shown in FIG. 1, the sensor unit 100U may include a micro-lens structure 108 disposed on the passivation layer 106. The micro-lens structure 108 may be in contact with the passivation layer 106 in accordance with some embodiments. Specifically, a bottom surface 108bs of the micro-lens structure 108 may be in contact with the passivation layer 106. The micro-lens structure 108 may be disposed above the sensor element 102 to direct light to the sensor element 102. In addition, in some embodiments, the bottom surface 108bs of the micro-lens structure 108 that is in contact with the passivation layer 106 may have a shape (ignoring the opening 108p) of circle, ellipse, triangle, rectangle, or hexagon, or a combination thereof.

Figure 2:
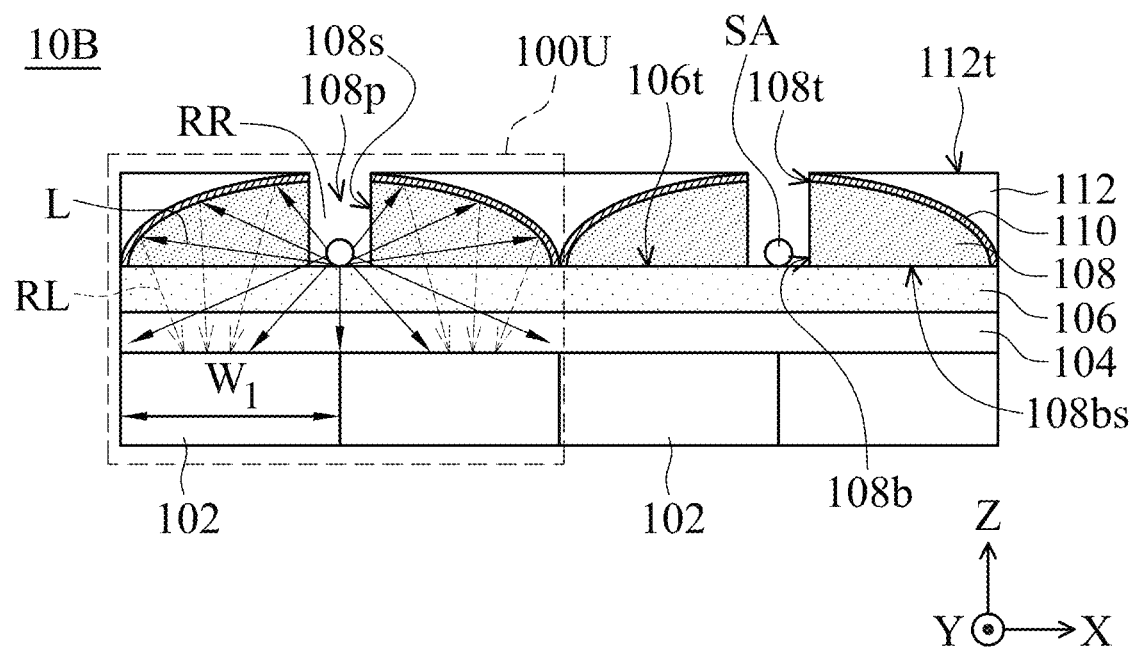
FIG. 2 is a cross-sectional diagram of a sensor device in accordance with some embodiments of the present disclosure.

In accordance with some embodiments, in a cross-sectional view, the micro-lens structure 108 may have a shape (ignoring the opening 108p) of semi-circle, semi-ellipse, triangle, rectangle, or another shape that can reflect light toward the sensor element 102. In some embodiments, the micro-lens structure 108 may have a parallel light or a single focus point corresponding to one sensor element 102 (e.g., as shown in FIG. 1), two focus points corresponding to two sensor elements 102 (e.g., as shown in FIG. 2), or a plurality of focus points 102 corresponding to three or four sensor elements.

In some embodiments, the material of the micro-lens structure 108 may include, but is not limited to, silicon oxide (e.g. $SiO_2$), polymethylmethacrylate (PMMA), cycloolefin polymer (COP), polycarbonate (PC), another suitable material, or a combination thereof. In some embodiments, the refractive index of the material of the micro-lens structure 108 may be the same as or similar to 1.33 (n=1.33) since most of the samples SA are reacted in aqueous solution and the refractive index of water is 1.33. In accordance with some embodiments, the micro-lens structure 108 may be transparent or semi-transparent. In some embodiments, the material of the micro-lens structure 108 may include photoresist, which may serve as a sacrificial layer for functional surface coating (e.g., self-assembly monolayers (SAMs)) and the functional surface coating may be located only at the bottom of the opening 108p. In such a configuration, the sacrificial layer may be further removed after functional surface coating and before biological detection process. Therefore, the pathway of light L and reflected light RL may be maintained and the reaction space may be greater. In addition, the material within the first reflecting layer 110 may be homogenous (e.g., all aqueous solution or air).

Furthermore, as shown in FIG. 1, the sensor unit 100U may include an opening 108p disposed in the micro-lens structure 108. In some embodiments, the opening 108p may extend from a top portion 108t of the micro-lens structure 108 to a bottom portion 108b of the micro-lens structure 108 and expose a portion of the passivation layer 106.

In some embodiments, the openings 108p in each sensor unit 100U may have a uniform dimension and may be arranged in a regular array. The openings 108p of an array may be organized in a rectilinear pattern, often in columns and rows, but in accordance with some embodiments, other regular patterns may be used. In addition, in accordance with some embodiments, in the top-view perspective, the openings 108p may have a shape that is circular, elliptical, rectangular, hexagonal, or any other suitable shape.

In some embodiments, the opening 108p may include a reaction region RR, the reaction region RR may be located at the bottom of the opening 108p. In some embodiments, the reaction region RR may correspond to at least one sensor element 102. For example, the reaction region RR may correspond to one, two, three or four sensor elements 102 in accordance with some embodiments. As shown in FIG. 1, each reaction region RR may correspond to one sensor element 102. In addition, the sample SA may be placed in the reaction region RR. The reaction region RR of the opening 108p may encompass the sample SA.

As described above, the sample SA may include the biological molecules in accordance with some embodiments. In some embodiments, the biological molecule may be associated with a fluorescent dye, chemiluminescent dye or bioluminescent dye. The fluorescent dye may be illuminated by excitation light from an excitation light source (not illustrated). The excitation light may correspond to any suitable type or intensity of light. For example, the excitation light may include, but is not limited to, visible light, infrared (IR), or ultraviolet (UV).

When the fluorescent dye is illuminated with excitation light at a specific wavelength, the biological molecule may absorb the light, and then emit light of a different wavelength. For example, in accordance with some embodiments, the biological molecule may absorb excitation light having a first wavelength, but emit light with a second wavelength, and the first wavelength is smaller than the second wavelength. In some embodiments where the interlayer 104 includes filters such as interference filter, the excitation light with the first wavelength may be filtered out and the emission light with the second wavelength can pass through the filter to improve the measurement accuracy of the sensor element 102.

On the other hand, in the embodiments where bioluminescence or chemiluminescence is used, no excitation light source is needed for the sensor element 102 to detect emitted light. Instead, the biological molecule may emit light due to a chemical or enzymatic reaction that may occur between the biological molecule and the bioluminescent or chemiluminescent dye, causing light to be emitted due to breaking or forming chemical bonds.

Moreover, referring to FIG. 1, the sensor unit 100U may include a first reflecting layer 110 disposed on the micro-lens structure 108. The first reflecting layer 110 may extend from the opening 108p to the passivation layer 106. In some embodiments, the first reflecting layer 110 may extend from the top portion 108t of the micro-lens structure 108 to the bottom portion 108b of the micro-lens structure 108. Specifically, the first reflecting layer 110 may extend from a sidewall 108s of the opening 108 to a top surface 106t of the passivation layer 106 in accordance with some embodiments. In addition, in some embodiments, the first reflecting layer 110 may be conformally formed on the micro-lens structure 108 and therefore may have a curved shape or another suitable shape. The shape and profile of the micro-lens structure 108 will be described in detail in the following context.

In some embodiments, the material of the first reflecting layer 110 may have a spectrum-selective property of high transmission for excitation light wavelength and high reflection for emission light wavelength, or may have a property of high reflection for both excitation light and emission light wavelength. Specifically, in some embodiments, the material of the first reflecting layer 110 may include, but is not limited to, silver (Ag), aluminum (Al), gold (Au), copper (Cu), niobium (Nb), nickel (Ni), titanium (Ti), tungsten (W), silver alloy, aluminum alloy, gold alloy, copper alloy, niobium alloy, nickel alloy, titanium alloy, tungsten alloy, or a combination thereof.

In particular, the first reflecting layer 110 may reflect light L that is emitted in the opposite direction from the sensor element 102 (e.g., the light that is emitted in the Z direction as shown in FIG. 1) back to the sensor element 102. Specifically, a reflected light RL that is reflected by the first reflecting layer 110 may be directed toward the sensor element 102 and therefore may increase the emission light collection efficiency of the sensor element 102. Accordingly, the sensitivity and performance of the sensor device 10A may be improved.

In addition, as shown in FIG. 1, the sensor unit 100U may further include a planarization layer 112 disposed on the first reflecting layer 110 in accordance with some embodiments. In some embodiments, the planarization layer 112 may cover the top surface of the first reflecting layer 110 and provide a planar top surface 112t over the micro-lens structure 108, and the planarization layer 112 does not disposed in the opening 108p.

In some embodiments, the material of the planarization layer 112 may include, but is not limited to, silicon oxide ($SiO_2$), amorphous silicon (a-Si), polymer, or a combination thereof. For example, the polymer may include, but is not limited to, Bisbenzocyclobutene (BCB), polyimide (PI), polymethylmethacrylate (PMMA), cycloolefin polymer (COP), polycarbonate (PC), another suitable material, or a combination thereof. In accordance with some embodiments, the planarization layer 112 may be transparent or semi-transparent.

In addition, in accordance with some embodiments, the sensor device 10A may be coupled to a flow cell (not illustrated). The flow cell may provide the sample SA to the reaction region RR of the sensor unit 100U. In some embodiments, the flow cell may include one or more flow channels that are in fluid communication with the reaction region RR in the opening 108p.

In accordance with some other embodiments, the sensor device 10A may be further coupled to a bioassay system. The bioassay system may deliver reagents to the reaction region RR of the sensor unit 100U according to a predetermined protocol and perform imaging events. In some embodiments, the bioassay system may direct solutions to flow along the reaction region RR. Specifically, in accordance with some embodiments, the solution may include four types of nucleotides having the same or different fluorescent labels. The bioassay system may illuminate the reaction region RR using an excitation light source having a predetermined wavelength range. The excited fluorescent labels may provide emission signals that may be detected by the sensor element 102.

Next, referring to FIG. 2, FIG. 2 is a cross-sectional diagram of a sensor device 10B in accordance with some other embodiments of the present disclosure. It should be understood that the same or similar components or elements in the context of the descriptions provided above and below are represented by the same or similar reference numerals. The materials, manufacturing methods and functions of these components or elements are the same as or similar to those described above, and thus will not be repeated herein.

The sensor device 10B in the embodiments shown in FIG. 2 is similar to the sensor device 10A in the embodiments shown in FIG. 1. The difference between them is that the sensor unit 100U of the sensor device 10B corresponds to two or four sensor elements 102. In addition, in this embodiment, the reaction region RR may correspond to two or four sensor elements 102. In this embodiment, the opening 108p may be disposed right above the interface of the two or four sensor elements 102. In other words, the reaction region RR may overlap the two or four sensor elements 102. In this embodiment, in a cross-sectional view, the micro-lens structure 108 may have a shape (ignoring the opening 108p) of semi-circle, semi-ellipse, or another shape that can reflect light toward the sensor element 102.

As described above, in some embodiments, the interlayer 104 may include the pixelated filters, and the pixelated filters corresponding to different sensor elements 102 may be filters of a single color or different colors. In this embodiment, one sensor unit 100U may include several pixelated filters, for example, two or four filters. In some embodiments, the adjacent sensor elements 102 may correspond to the pixelated filters of different colors, the filter transmittance spectrum may be a shortpass, bandpass, long pass, or multiple bandpass.

For example, in the embodiments where one sensor unit 100U includes two pixelated filters, one of them is the red color filter and the other is the blue color filter, but the present disclosure is not limited thereto. In such embodiments, the reaction region RR may overlap both the red color filter and the blue color filter such that the light emitted from the sample SA may enter both the red color filter and the blue color filter, and such that the light emitted through different color filters (having different wavelength range) may be detected.

For example, in other embodiments where one sensor unit 100U includes four pixelated filters, one of them is the red color filter, one of them is the blue filter, one of them is green filter and the other is the yellow color filter, but the present disclosure is not limited thereto. In such embodiments, the reaction region RR may overlap both the red color filter, the blue color filter, the green filter and the yellow color filter such that the light emitted from the sample SA may enter all of the red color filter, the blue color filter, the green filter and the yellow color filter, and such that the light emitted through different color filters (having different wavelength range) may be detected.

As described above, in accordance with some embodiments, the sample SA may include four types of nucleotides having different labels corresponding to different wavelengths. For example, in the embodiments where the sensor device is used for DNA sequencing, the specific sequence of nucleotide bases of the DNA strand) may be determined. In such embodiments, the different nucleotide bases (e.g., adenine (A), guanine (G), cytosine (C), or thymine (T)) may be labeled with different fluorescent, chemiluminescent or bioluminescent labels (e.g., labeled with four different colors). In addition, in such embodiments, the sensor unit 100U including four pixelated filters having four different color filters (that may correspond to four nucleotide bases) may be used.

Figure 3A:
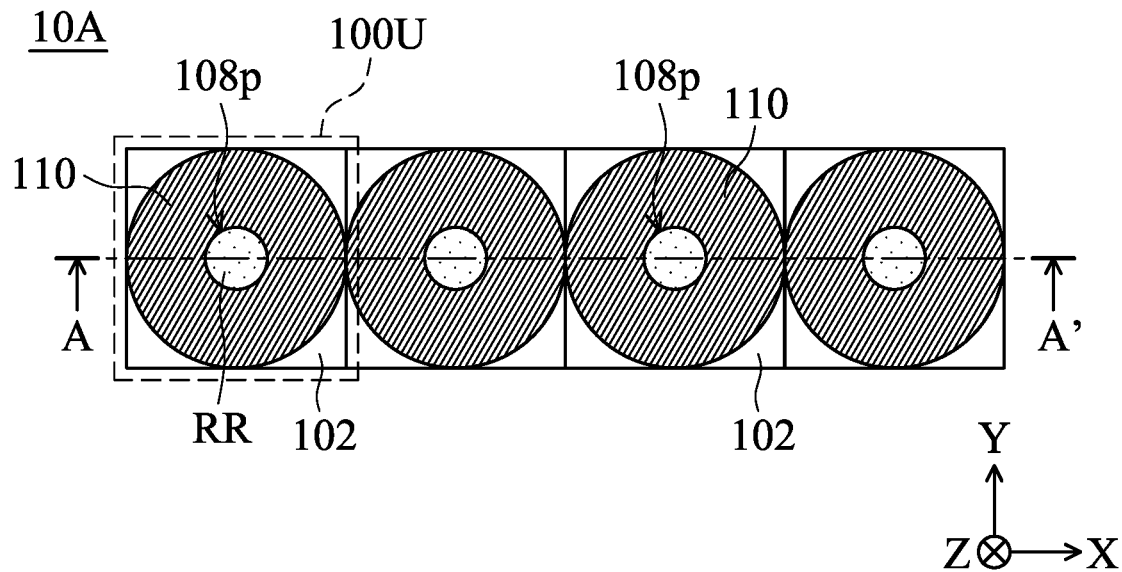
FIGS. 3A-3C are top-view diagrams of a sensor device in accordance with some embodiments of the present disclosure.

Next, referring to FIG. 3A, FIG. 3A is a top-view diagram of the sensor device 10A in accordance with some embodiments of the present disclosure. The line segment A-A' illustrated in FIG. 3A may correspond to the cross-sectional view as shown in FIG. 1. It should be understood that some of the components (e.g., the planarization layer 112) are omitted for clarity.

As shown in FIG. 3A, the opening 108p may be located within the micro-lens structure 108 and the first reflecting layer 110 in accordance with some embodiments. The reaction region RR may be defined by the opening 108p. In some embodiments, the first reflecting layer 110 may be a continuous structure. In some embodiments, in a top-view perspective, the first reflecting layer 110 may substantially have the shape of a circle. In addition, as shown in FIG. 3A, one reaction region RR may correspond to one sensor element 102 (may also refer to one pixel) in accordance with some embodiments.

Figure 3B:
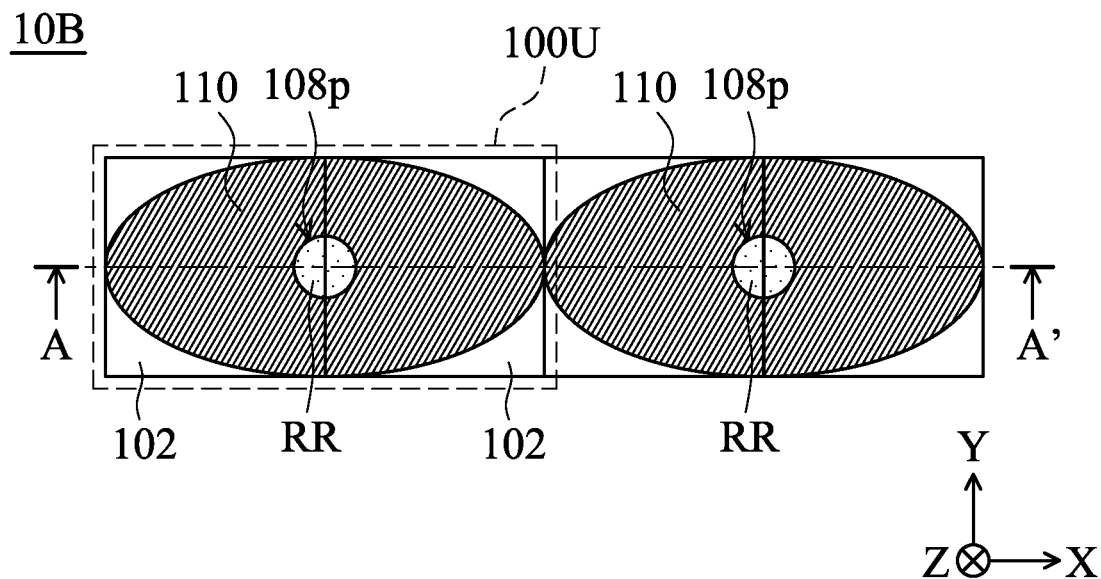

Referring to FIG. 3B, FIG. 3B is a top-view diagram of the sensor device 10B in accordance with some embodiments of the present disclosure. The line segment A-A' illustrated in FIG. 3B may correspond to the cross-sectional view as shown in FIG. 2. It should be understood that some of the components (e.g., the planarization layer 112) are omitted for clarity.

As shown in FIG. 3B, the opening 108p may be located within the micro-lens structure 108 and the first reflecting layer 110 in accordance with some embodiments. The reaction region RR may be defined by the opening 108p. In some embodiments, the first reflecting layer 110 may be a continuous structure. In some embodiments, in a top-view perspective, the first reflecting layer 110 may substantially have the shape of an ellipse. In addition, as shown in FIG. 3B, one reaction region RR may correspond to two sensor elements 102 (may also refer to two pixels) in accordance with some embodiments. In other words, the opening 108p may overlap with two sensor elements 102.

Figure 3C:
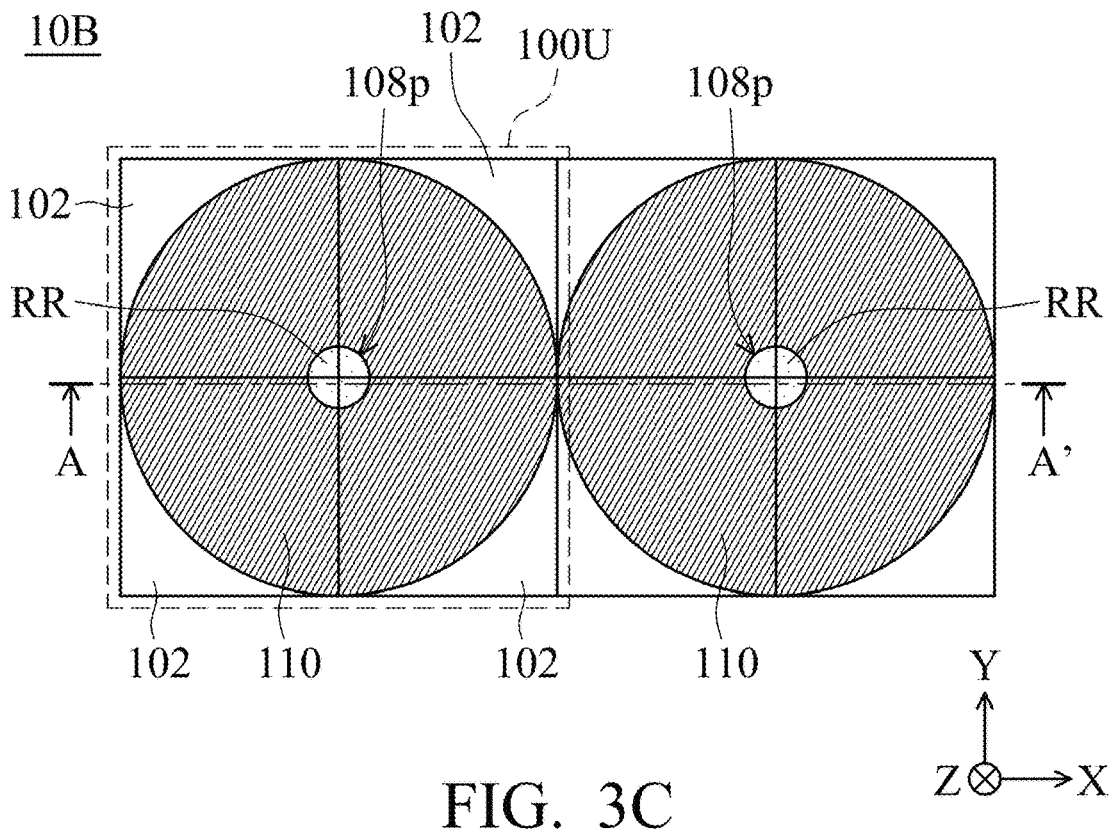

Next, referring to FIG. 3C, FIG. 3C is a top-view diagram of the sensor device 10B in accordance with some other embodiments of the present disclosure. The line segment A-A' illustrated in FIG. 3C may correspond to the cross-sectional view as shown in FIG. 2. It should be understood that some of the components (e.g., the planarization layer 112) are omitted for clarity.

As shown in FIG. 3C, the opening 108p may be located within the micro-lens structure 108 and the first reflecting layer 110 in accordance with some embodiments. The reaction region RR may be defined by the opening 108p. In some embodiments, the first reflecting layer 110 may be a continuous structure. In some embodiments, in a top-view perspective, the first reflecting layer 110 may substantially have the shape of a circle. In addition, as shown in FIG. 3C, one reaction region RR may correspond to four sensor elements 102 (may also refer to four pixels) in accordance with some embodiments. In other words, the opening 108*p* may overlap with four sensor elements 102.

In addition, in some embodiments, the opening 108 may be located at the center of the first reflecting layer 110. In some other embodiments, the opening 108 may not be located at the center of the first reflecting layer 110 in order to correspond to the placement of sensor element 102 or the optical pathway design in the structure.

Figure 4:
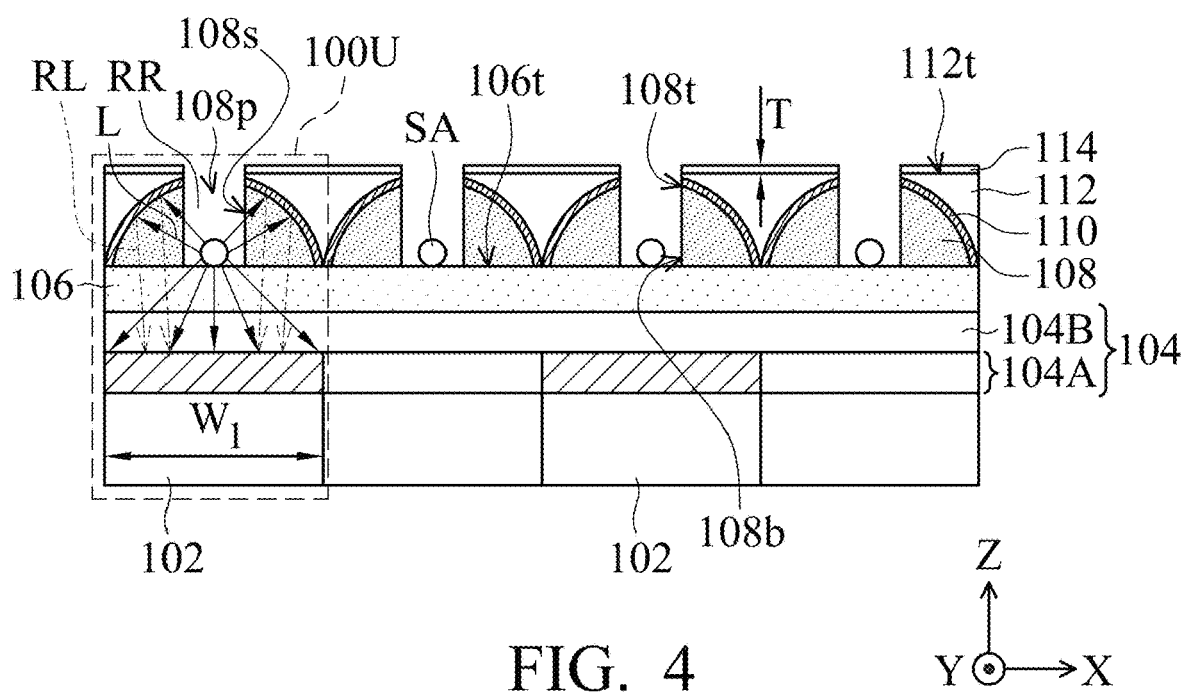
FIG. 4 is a cross-sectional diagram of a sensor device in accordance with some embodiments of the present disclosure.

Next, referring to FIG. 4, FIG. 4 is a cross-sectional diagram of a sensor device 10C in accordance with some other embodiments of the present disclosure. The sensor device 10C in the embodiments shown in FIG. 4 is similar to the sensor device 10A in the embodiments shown in FIG. 1. The difference between them is that the sensor device 10C may further include a surface modification layer 114 disposed on the planarization layer 112 in accordance with some embodiments. In addition, as shown in FIG. 4, the interlayer 104 may be a multi-layered structure in accordance with some embodiments.

Specifically, in some embodiments, the surface modification layer 114 may be disposed on the top surface 112*t* of the planarization layer 112. In some embodiments, the surface modification layer 114 may include, but is not limited to, a silane coating, a thiol coating, or a combination thereof. In some embodiments, the material of the silane coating may include, but is not limited to, metal oxides, silicon oxide ($SiO_2$), silicon nitrides ($Si_3N_4$), or a combination thereof. In some embodiments, the material of the thiol coating may include, but is not limited to, gold (Au). In some other embodiments, the surface modification layer 114 may be treated by any suitable modification process to possess the desired surface properties.

In some embodiments, the surface modification layer 114 may also be disposed in the opening 108*p*. In some embodiments, the passivation layer 106 may be modified to be able to catch the biosample SA (e.g., modified with amino-silane), and the surface modification layer 114 may be modified to be unable to catch the biosample SA (e.g., modified with OH-thiol). In other words, the passivation layer 106 and the surface modification layer 114 may have different modification characteristics. However, in some embodiments where the surface modification layer 114 is disposed in the opening 108*p* (or the passivation layer 106 and the surface modification layer 114 have the same or similar modification characteristics), the biosample SA may be fixed in the reaction region RR by its weight, size, or charge and so on. In addition, the surface modification layer 114 may have a thickness T. In some embodiments, the thickness T of the surface modification layer 114 may be in a range from about 1 nm to about 500 nm, or from about 5 nm to about 100 nm.

As shown in FIG. 4, in some embodiments, the interlayer 104 may include a first layer 104A and a second layer 104B disposed on the first layer 104A. In some embodiments, the first layer 104A may include the pixelated filters and the second layer 104B may include the rejection filter or the interference filter. In some embodiments, the rejection filter may include a laser rejection filter.

Figure 5:
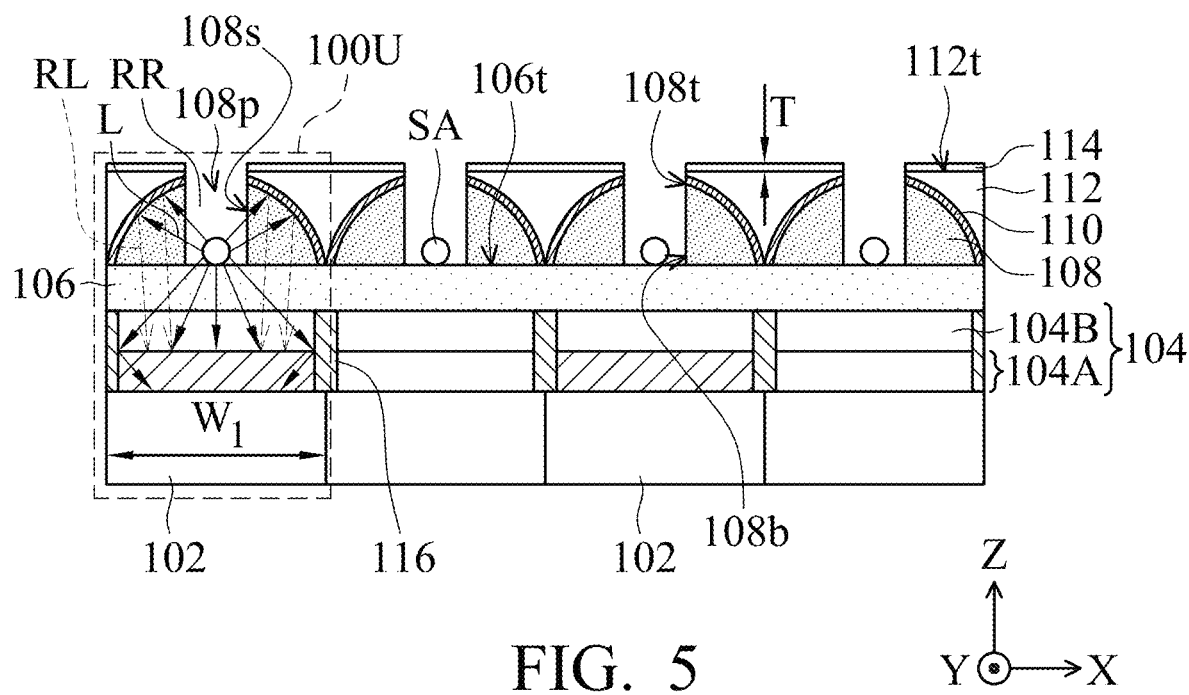
FIG. 5 is a cross-sectional diagram of a sensor device in accordance with some embodiments of the present disclosure.

Next, referring to FIG. 5, FIG. 5 is a cross-sectional diagram of a sensor device 10D in accordance with some other embodiments of the present disclosure. The sensor device 10D in the embodiments shown in FIG. 5 is similar to the sensor device 10C in the embodiments shown in FIG. 4. The difference between them is that the interlayer 104 may further include a metal layer 116 in the sensor device 10D.

In accordance with some embodiments, the metal layer 116 may include a metal wire, a metal shield, or a combination thereof. In some embodiments, the metal layer 116 may be disposed in the interlayer 104. More specifically, the metal layer 116 may be in contact with the filter, or passivation material in the interlayer 104. In some embodiments, the metal layer 116 may be located at the interface between the adjacent sensor elements 102. In some embodiments, the filter may be surrounded by the metal layer 116 in the interlayer 104 to reduce crosstalk from the neighboring sensor elements 102.

In some embodiments, the material of the metal layer 116 may include, but is not limited to, silver (Ag), aluminum (Al), gold (Au), copper (Cu), niobium (Nb), nickel (Ni), titanium (Ti), tungsten (W), silver alloy, aluminum alloy, gold alloy, copper alloy, niobium alloy, nickel alloy, titanium alloy, tungsten alloy, or a combination thereof.

Figure 6A:
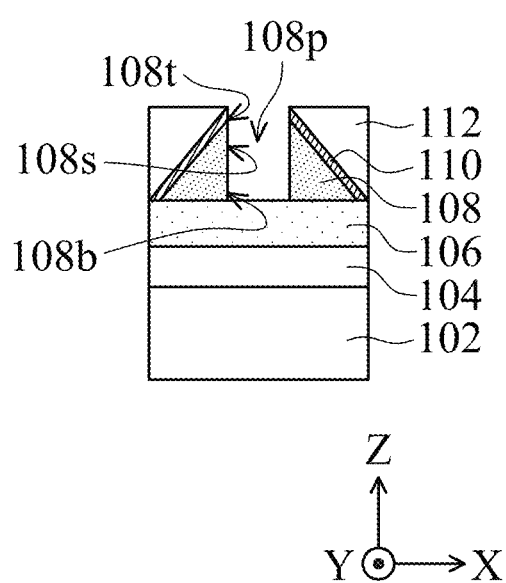
FIGS. 6A-6B are cross-sectional diagrams of a sensor unit in accordance with some embodiments of the present disclosure.
Figure 6B:
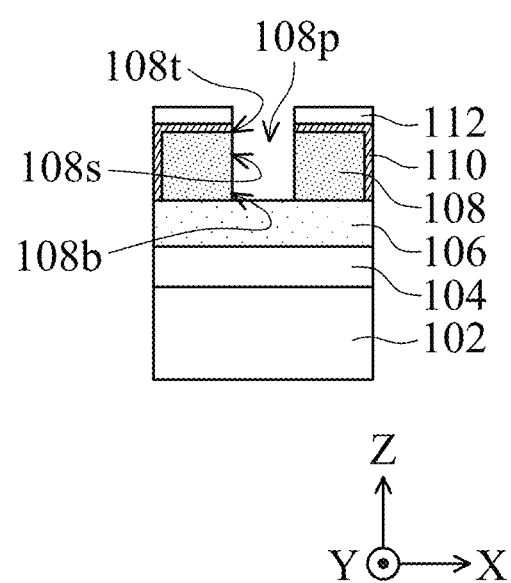

Next, referring to FIG. 6A and FIG. 6B, FIG. 6A and FIG. 6B are cross-sectional diagrams of the sensor unit 100U in accordance with some embodiments of the present disclosure. As shown in FIG. 6A, in a cross-sectional view, the micro-lens structure 108 may have the shape of a triangle (ignoring the opening 108*p*) in accordance with some embodiments. In some embodiments, the first reflecting layer 110 may be conformally formed on the micro-lens structure 108 and therefore may have a straight-line shape in the cross-sectional view. The first reflecting layer 110 having such a configuration may reflect the light toward the sensor element 102.

Similarly, in these embodiments, the first reflecting layer 110 may extend from the opening 108*p* to the passivation layer 106. The first reflecting layer 110 may extend from the top portion 108*t* of the micro-lens structure 108 to the bottom portion 108*b* of the micro-lens structure 108. Specifically, the first reflecting layer 110 may extend from a sidewall 108*s* of the opening 108 to a top surface 106*t* of the passivation layer 106 in accordance with some embodiments.

Referring to FIG. 6B, in a cross-sectional view, the micro-lens structure 108 may have the shape of a rectangle (ignoring the opening 108*p*) in accordance with some embodiments. In some embodiments, the first reflecting layer 110 may be conformally formed on the micro-lens structure 108 and therefore may have a bent shape in the cross-sectional view. The first reflecting layer 110 having such a configuration may reflect the light toward the sensor element 102.

Figure 7:
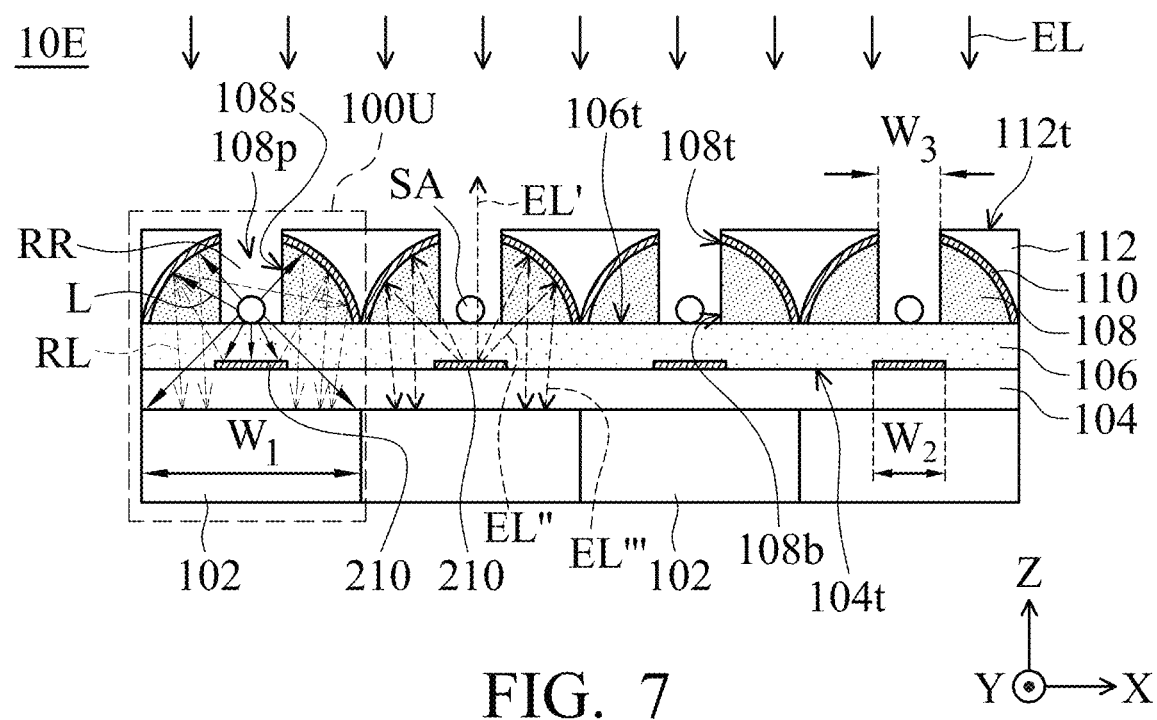
FIG. 7 is a cross-sectional diagram of a sensor device in accordance with some embodiments of the present disclosure.

Next, referring to FIG. 7, FIG. 7 is a cross-sectional diagram of a sensor device 10E in accordance with some other embodiments of the present disclosure. The sensor device 10E in the embodiments shown in FIG. 7 is similar to the sensor device 10A in the embodiments shown in FIG. 1. The difference between them is that second the sensor unit 100U further includes a second reflecting layer 210 in the sensor device 10E.

As shown in FIG. 7, the second reflecting layer 210 may be disposed between the interlayer 104 and the micro-lens structure 108 in accordance with some embodiments. In some embodiments, as shown in FIG. 7, the second reflecting layer 210 may be disposed on a top surface 104*t* of the interlayer 104. In some other embodiments, the second reflecting layer 210 may be disposed at any position between the top surface 106*t* of the passivation layer 106 and the top surface 104*t* of the interlayer 104.

In some embodiments, the opening 108*p* may overlap the second reflecting layer 210. The second reflecting layer 210 may have a width $W_2$ and the opening 108*p* may have a width $W_3$. In some embodiments, the width $W_2$ of the second reflecting layer 210 may be greater than or equal to the width $W_3$ of the opening 108*p*.

In some embodiments, the material of the second reflecting layer 210 may have a spectrum-selective property of high reflection for excitation light wavelength and high transmission for emission light wavelength, or may have a property of high reflection for both excitation light and emission light wavelength. Specifically, in some embodiments, the material of the second reflecting layer 210 may include, but is not limited to, silver (Ag), aluminum (Al), gold (Au), copper (Cu), niobium (Nb), nickel (Ni), titanium (Ti), tungsten (W), silver alloy, aluminum alloy, gold alloy, copper alloy, niobium alloy, nickel alloy, titanium alloy, tungsten alloy, or a combination thereof.

In accordance with some embodiments, the second reflecting layer 210 may decrease the interference of an excitation light EL to the sensor element 102. Specifically, the second reflecting layer 210 may block a portion of the excitation light EL from entering reflecting layer 210 by reflecting back the excitation light EL to be a second excitation light EL', which passes through the opening area of the first reflecting layer 110. In this embodiment, the excitation light EL colliding with the second reflecting layer 210 may generate a scattering light EL" having random direction (from small to large incident angle against the normal direction of the sensor element 102) with the same wavelength of excitation light EL. In some embodiments, the second reflecting layer 210 incorporated with the first reflecting layer 110 may re-direct the scattering of excitation light EL" as excitation light EL''', which has a small angle against the normal direction of the sensor element 102 (e.g., the Z direction shown in FIG. 7), to the sensor element 102. In addition, in the embodiments where the interlayer 104 includes the interference filter, the excitation light EL having a small angle with the normal direction of the sensor element 102 may be filtered out efficiently.

Furthermore, in accordance with some embodiments, with the configuration of the second reflecting layer 210 that provides higher excitation light filtering efficiency, the thickness of the filter layer in the interlayer 104 may be thinner (i.e. the distance between the reaction region RR and the sensor element 102 may be decreased) so that the overall thickness of the sensor device 10E may be reduced.

Figure 8:
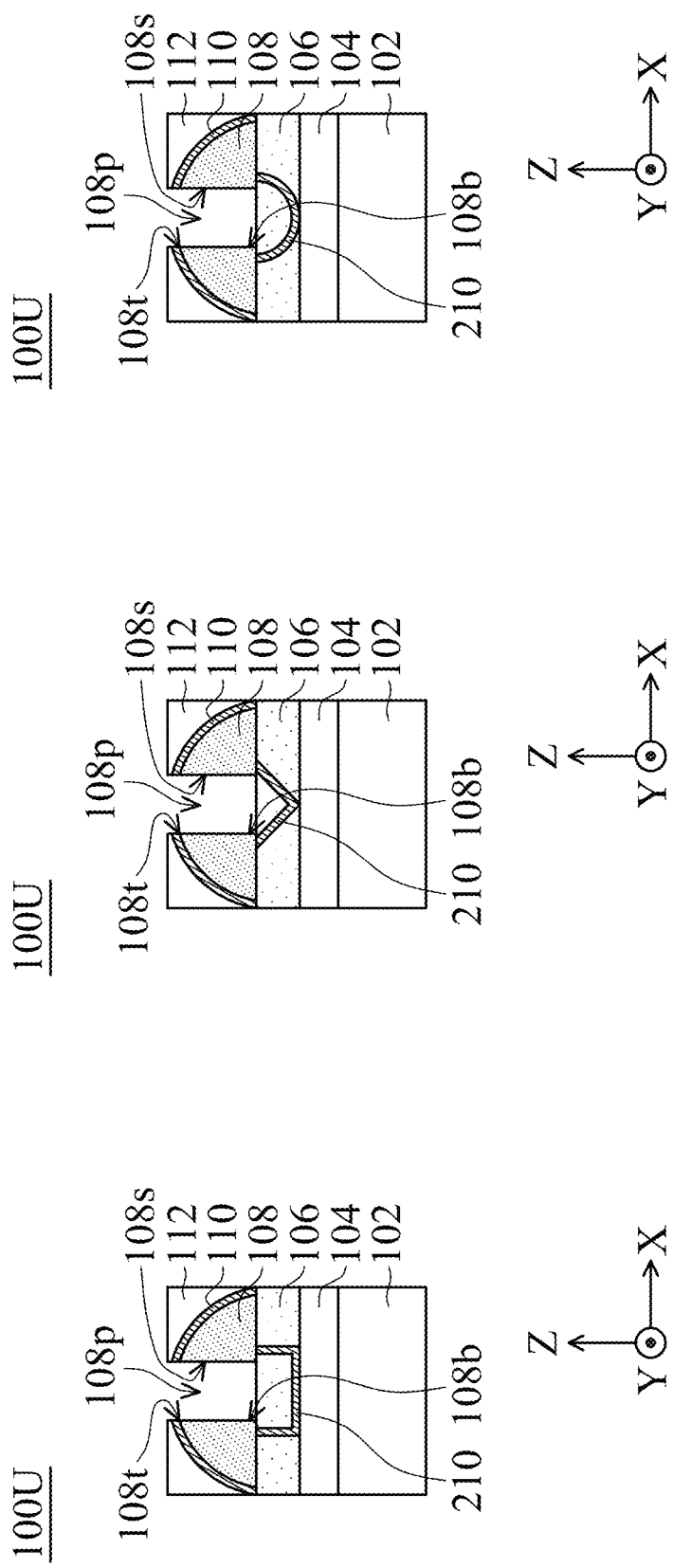
FIGS. 8A-8C are cross-sectional diagrams of a sensor unit in accordance with some embodiments of the present disclosure.

Next, referring to FIGS. 8A-8C, FIGS. 8A-8C are cross-sectional diagrams of the sensor unit 100U in accordance with some embodiments of the present disclosure. As shown in FIGS. 8A-8C, the second reflecting layer 210 may have a bent shape in accordance with some embodiments. More specifically, the bent shape of the second reflecting layer 210 may include a recess and the opening of the recess may face toward the opening 108*p*.

As shown in FIG. 8A, in some embodiments, in the cross-sectional view, the second reflecting layer 210 may have a profile of "three-sided recess" or "recess including two bottom corners". As shown in FIG. 8B, in some embodiments, in the cross-sectional view, the second reflecting layer 210 may have a V-shape. As shown in FIG. 8B, in some embodiments, in the cross-sectional view, the second reflecting layer 210 may have a U-shape.

In accordance with some embodiments, the bent shape of the second reflecting layer 210 may increase the reflection of the excitation light EL' away from the sensor element 102.

In addition, the reflected excitation light EL' may pass through the opening 108*p*, which is defined by the first reflecting layer 110.

Figure 9:
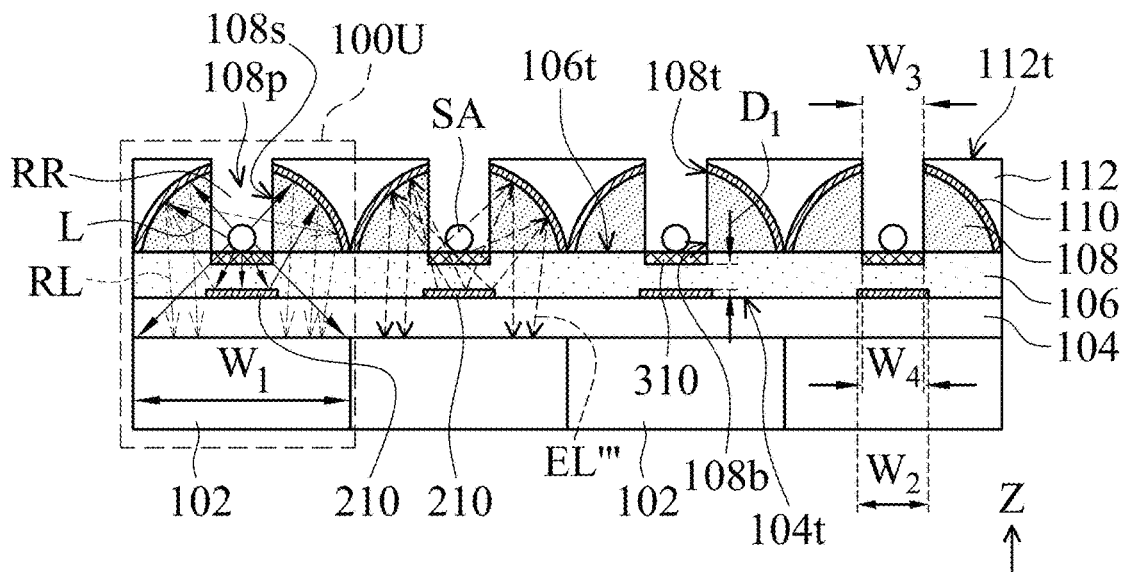
FIG. 9 is a cross-sectional diagram of a sensor device in accordance with some embodiments of the present disclosure.

Next, referring to FIG. 9, FIG. 9 is a cross-sectional diagram of a sensor device 10F in accordance with some other embodiments of the present disclosure. The sensor device 10F in the embodiments shown in FIG. 9 is similar to the sensor device 10E in the embodiments shown in FIG. 7. The difference between them is that the sensor device 10F further includes a waveguide structure 310 disposed above the second reflecting layer 210.

In accordance with some embodiments, the waveguide structure 310 may enhance the intensity and localize the excitation light EL in the reaction region RR and therefore the energy of the excitation light source that is used may be decreased and the intensity of excitation light EL''' (to the sensor element 102 may be reduced. In addition, in accordance with some embodiments, the waveguide structure 310 may improve the signal quality that the sensor element 102 receives.

As shown in FIG. 9, the waveguide structure 310 may be disposed near the top surface 106*t* of the passivation layer 106 in accordance with some embodiments. In some embodiments, the opening 108*p* may overlap the waveguide structure 310. In addition, the waveguide structure 310 may be located below the opening 108*p* and in contact with the opening 108*p* in accordance with some embodiments. In some other embodiments, the waveguide structure 310 may be located in the passivation layer 106 and not in contact with the opening 108*p*.

More specifically, in some embodiments, the waveguide structure 310 and the second reflecting layer 210 are spaced apart by a distance $D_1$. In some embodiments, the distance $D_1$ may be in a range from about 0.1 µm to about 5 µm, or from about 0.1 µm to about 1 µm, or from about 0.2 µm to about 0.4 µm. It should be understood that if the distance $D_1$ is too large, the thickness of the passivation layer 106 may not be reduced. On the other hand, if the distance $D_1$ is too small, the waveguide structure 310 may be too close to the second reflecting layer 210 so that the light-guiding effect of the waveguide structure 310 may be reduced.

In some embodiments, the waveguide structure 310 may have a width $W_4$. In some embodiments, the width $W_4$ of the waveguide structure 310 may be greater than or equal to the width $W_3$ of the opening 108*p*. In some embodiments, the width $W_4$ of the waveguide structure 310 may be smaller than or equal to the width $W_2$ of the second reflecting layer 210.

In some embodiments, the material of the waveguide structure 310 may include a material having a refractive index (n value) higher than 1.5 in a wavelength range from 400 nm to 750 nm. In other words, the waveguide structure 310 may be formed of the material having high refractive index in the range of visible light in accordance with some embodiments. Specifically, in some embodiments, the material of the waveguide structure 310 may include, but is not limited to, niobium oxide ($Nb_2O_5$), tantalum oxide ($Ta_2O_5$), titanium oxide ($TiO_2$), silicon nitride ($Si_3N_4$), aluminum oxide ($Al_2O_3$), high refractive index polymer, or a combination thereof.

Figure 10:
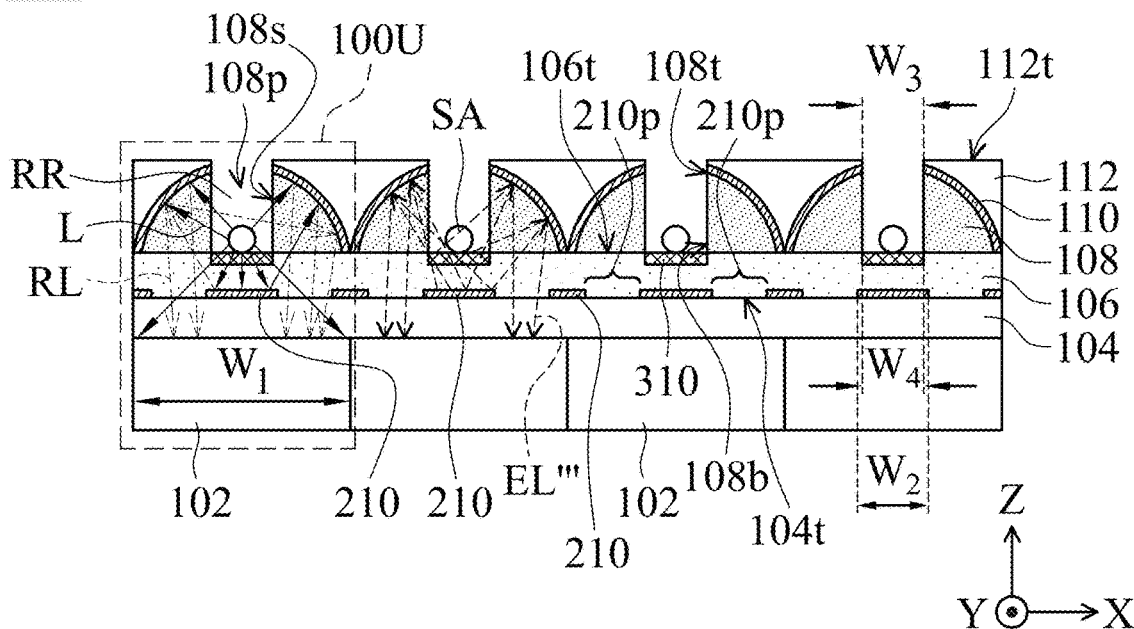
FIG. 10 is a cross-sectional diagram of a sensor device in accordance with some embodiments of the present disclosure.

Next, referring to FIG. 10, FIG. 10 is a cross-sectional diagram of a sensor device 10G in accordance with some other embodiments of the present disclosure. The sensor device 10G in the embodiments shown in FIG. 10 is similar to the sensor device 10F in the embodiments shown in FIG.

9. The difference between them is that the second reflecting layer 210 is patterned and includes an aperture 210p in the sensor device 10G.

As shown in FIG. 10, the second reflecting layer 210 may be patterned and the aperture 210p may be disposed within second reflecting layer 210 in the accordance with some embodiments. In addition, in some embodiments, the aperture 210p may overlap with the micro-lens structure 108 and the first reflecting layer 110. In some embodiments, the reflected light RL may enter the sensor element 102 through the aperture 210p.

In accordance with some embodiments, the aperture 210p located within the second reflecting layer 210 may reduce the amount of reflected light RL from entering to the adjacent sensor elements 102, and therefore may reduce the issues of crosstalk.

Figure 11:
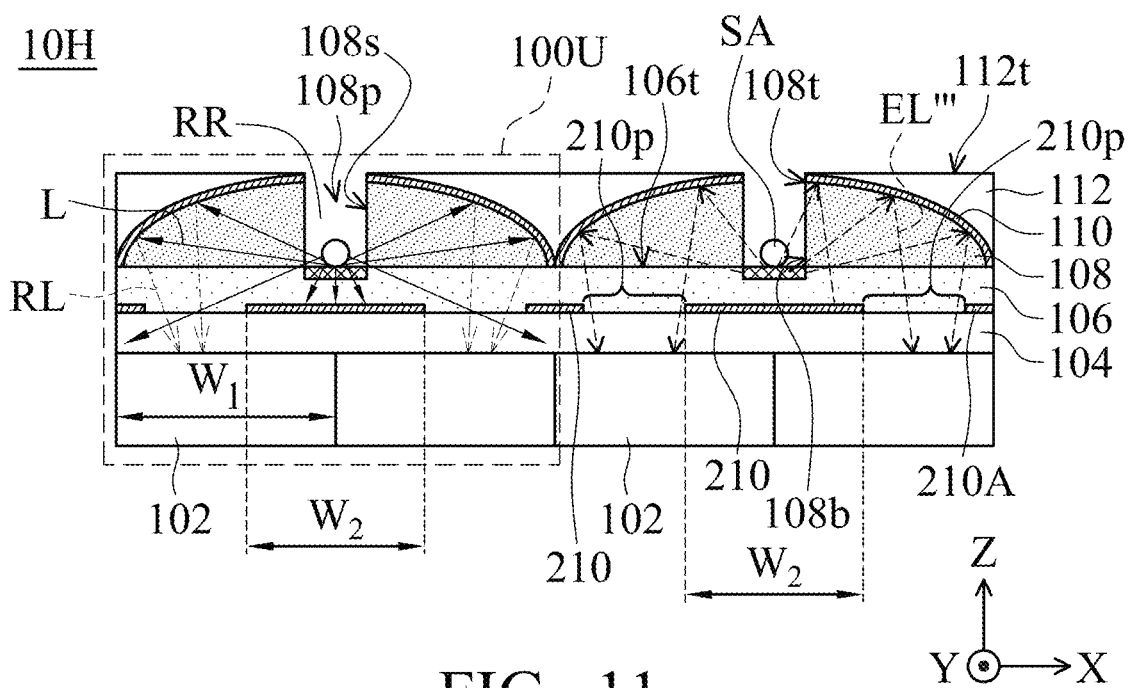
FIG. 11 is a cross-sectional diagram of a sensor device in accordance with some embodiments of the present disclosure.

Next, referring to FIG. 11, FIG. 11 is a cross-sectional diagram of a sensor device 10H in accordance with some other embodiments of the present disclosure. The sensor device 10H in the embodiments shown in FIG. 11 is similar to the sensor device 10G in the embodiments shown in FIG. 10. The difference between them is that the sensor unit 100U may include more than one sensor elements 102, such as two or four sensor elements 102.

As shown in FIG. 11, the second reflecting layer 210 may extend above more than one sensor elements 102 and the aperture 210p may be located above more than one sensor elements 102 in one sensor unit 100U in accordance with some embodiments.

Referring to FIGS. 12A-12J, FIGS. 12A-12J are top-view diagrams of the sensor unit 100U in accordance with some embodiments of the present disclosure. It should be understood that only the sensor element 102, the second reflecting layer 210 and the aperture 210p are illustrated in the figures to clearly explain the configuration of these components.

Figure 12A:
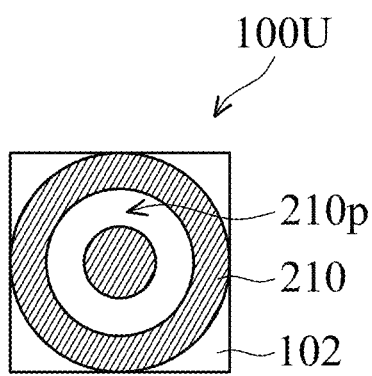
FIGS. 12A-12J are top-view diagrams of a sensor unit in accordance with some embodiments of the present disclosure.
Figure 12B:
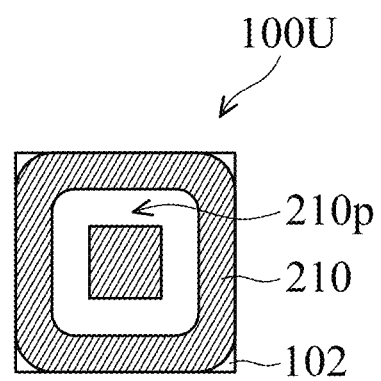

FIGS. 12A-12J illustrate various aspects of the second reflecting layer 210 in accordance with some embodiments of the present disclosure, but the present disclosure is not limited thereto. As shown in FIG. 12A and FIG. 12B, in some embodiments, the second reflecting layer 210 may be patterned to include the aperture 210p located therein. The aperture 210p may surround a portion of the patterned second reflecting layer 210 in accordance with some embodiments. In some embodiments, the aperture 210p may have the shape of a circle ring, rectangle ring, or any other suitable shape, but it is not limited thereto. In the embodiments where one sensor unit 100U includes one sensor element 102, the aperture 210p may correspond to one sensor element 102.

As shown in FIGS. 12C-12F, in some embodiments, the second reflecting layer 210 may be patterned to include the aperture 210p located therein. The aperture 210p may surround a portion of the patterned second reflecting layer 210 in accordance with some embodiments. In some embodiments, the aperture 210p may have the shape of a circle, rectangle, circle ring, rectangle ring, or any other suitable shape, but it is not limited thereto. In the embodiments where one sensor unit 100U includes two sensor elements 102, the aperture 210p may correspond to one or two sensor elements 102.

Figure 12C:
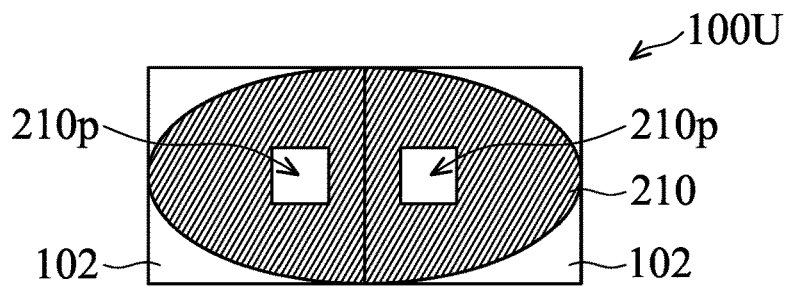
Figure 12D:
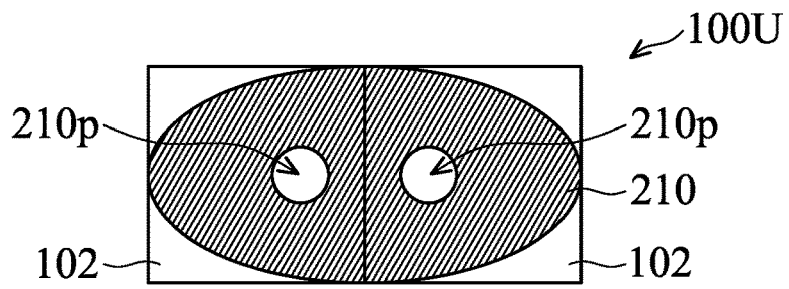
Figure 12E:
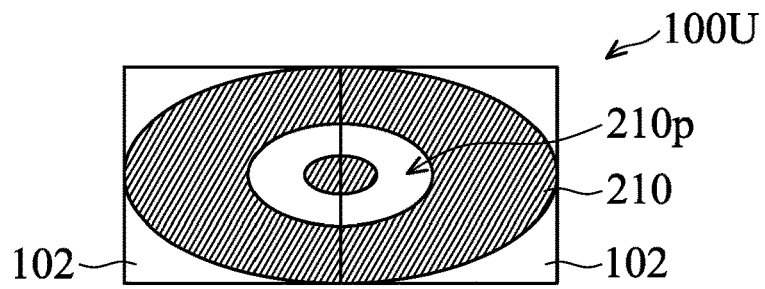
Figure 12F:
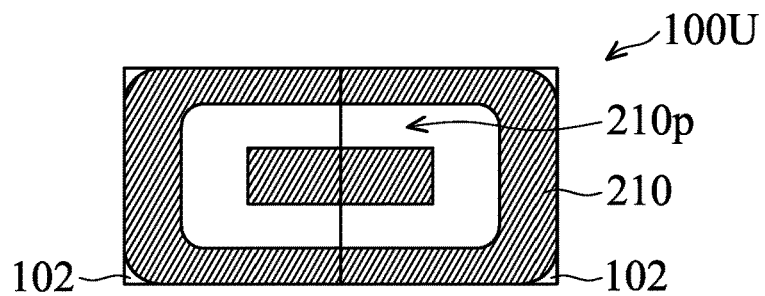

As shown in FIG. 12C and FIG. 12D, the apertures 210p may be separately disposed above the two sensor elements 102 in accordance with some embodiments. As shown in FIG. 12E and FIG. 12F, the aperture 210p may be a continuous structure above the two sensor elements 102 in accordance with some embodiments.

As shown in FIGS. 12G-12J, in some embodiments, the second reflecting layer 210 may be patterned to include the aperture 210p located therein. The aperture 210p may surround a portion of the patterned second reflecting layer 210 in accordance with some embodiments. In some embodiments, the aperture 210p may have the shape of a circle, rectangle, circle ring, rectangle ring, or any other suitable shape, but it is not limited thereto. In the embodiments where one sensor unit 100U includes four sensor elements 102, the aperture 210p may correspond to one, two, three or four sensor elements 102.

Figure 12G:
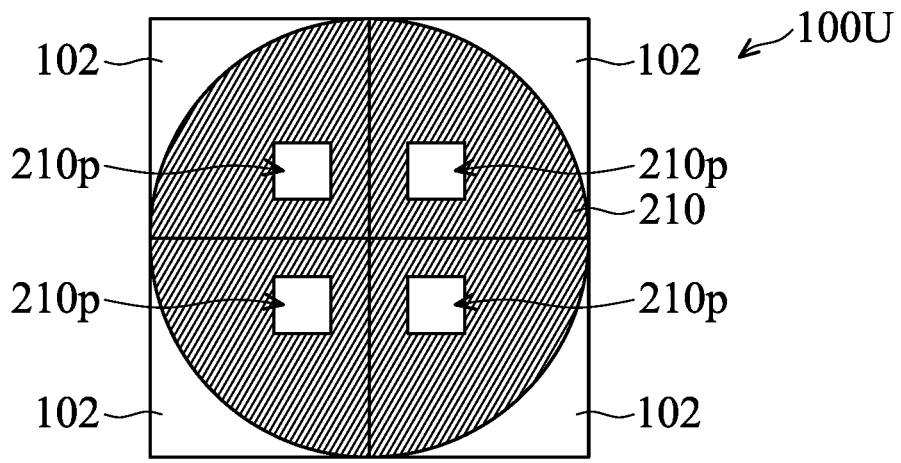
Figure 12H:
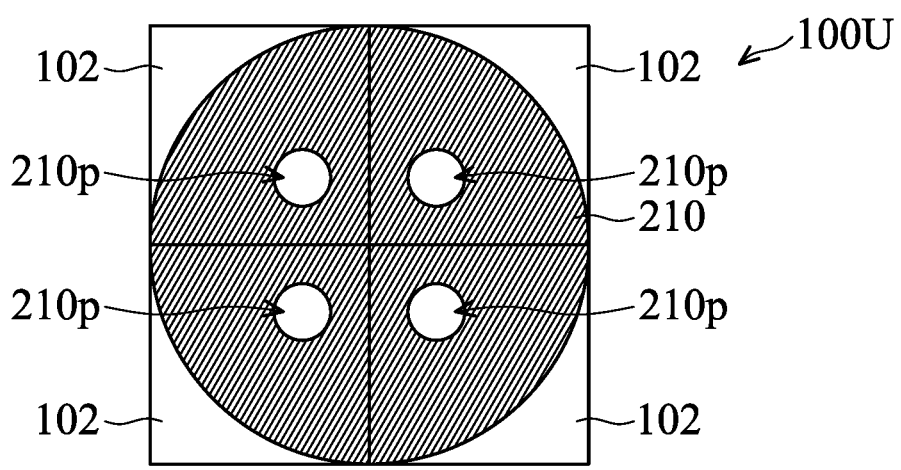
Figure 12I:
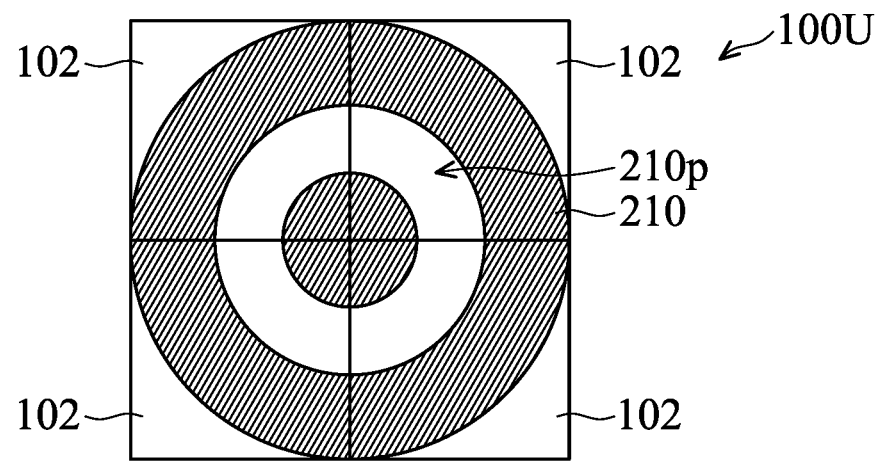
Figure 12J:
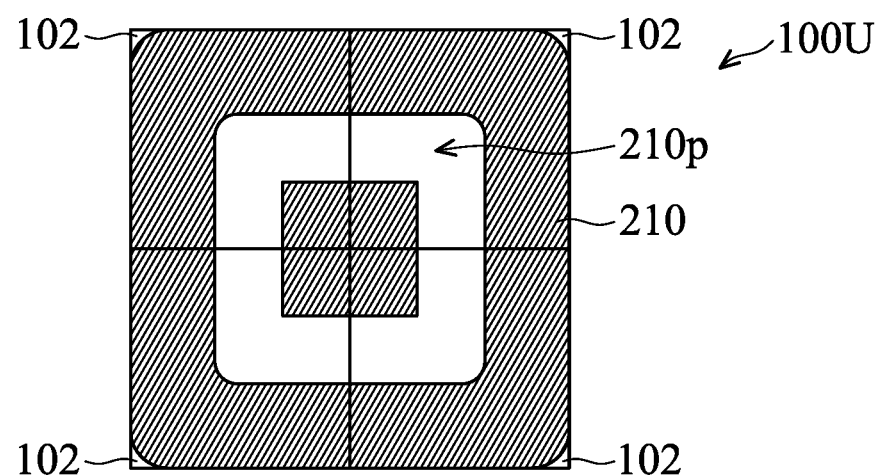

As shown in FIG. 12G and FIG. 12H, the apertures 210p may be separately disposed above the four sensor elements 102 in accordance with some embodiments. As shown in FIG. 12I and FIG. 12J, the aperture 210p may be a continuous structure above the four sensor elements 102 in accordance with some embodiments.

Next, referring to FIGS. 13A-13H, FIGS. 13A-13H are cross-sectional diagrams of the sensor device 10A in various stages of the process for manufacturing the sensor device in accordance with some embodiments of the present disclosure. It should be understood that additional operations may be provided before, during, and/or after processes for manufacturing the sensor device. In accordance with some embodiments, some of the operations described below may be replaced or eliminated.

Figure 13A:
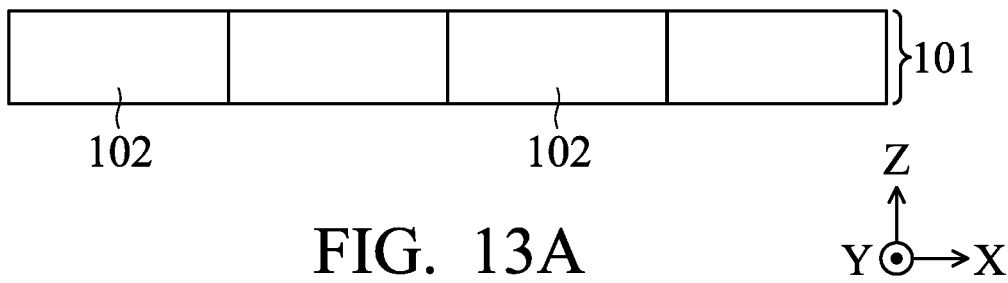
FIGS. 13A-13H are cross-sectional diagrams of a sensor device in various stages of the manufacturing process in accordance with some embodiments of the present disclosure.

First, referring to FIG. 13A, a substrate 101 is provided. The substrate 101 may include at least one sensor element 102 disposed therein. In other words, the sensor element 102 may be configured in the substrate 101 in accordance with some embodiments. In some embodiments, the substrate 101 may be a wafer formed of semiconductor materials. In some embodiments, the material of the substrate 101 may include, but is not limited to, silicon, III-V group on silicon, graphene-on-silicon, silicon-on-insulator, or a combination thereof.

Figure 13B:
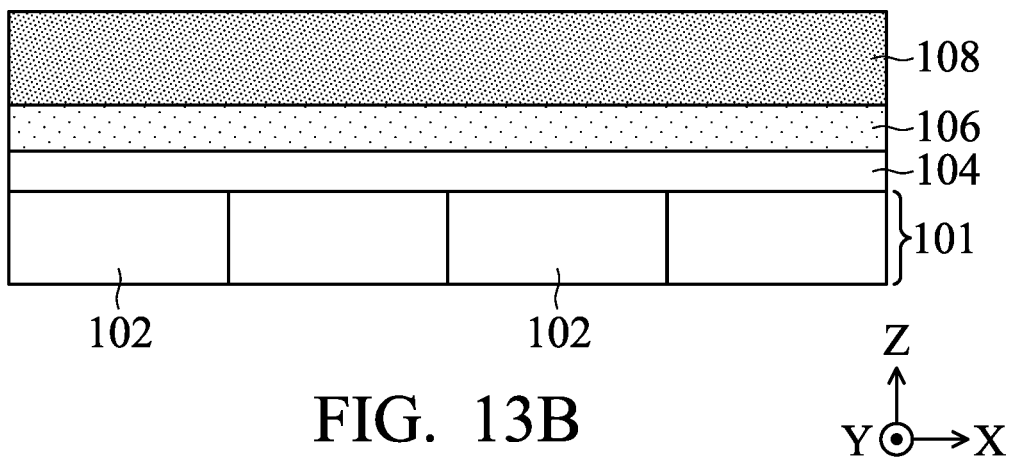

Next, referring to FIG. 13B, the interlayer 104 may be formed on the substrate 101 and the sensor element 102 in accordance with some embodiments. Thereafter, the passivation layer 106 may be formed on the interlayer 104 in accordance with some embodiments.

In some embodiments, the interlayer 104 and the passivation layer 106 may be formed by a chemical vapor deposition (CVD) process, a physical vapor deposition (PVD) process, a spin coating process, a printing process, any other applicable method, or a combination thereof. For example, the chemical vapor deposition process may include, but is not limited to, a low-pressure chemical vapor deposition (LPCVD) process, a low-temperature chemical vapor deposition (LTCVD) process, a rapid thermal chemical vapor deposition (RTCVD) process, a plasma enhanced chemical vapor deposition (PECVD) process, or an atomic layer deposition (ALD) process. For example, the physical vapor deposition may include, but is not limited to, a sputtering process, an evaporation process, or a pulsed laser deposition (PLD) process.

In addition, after the passivation layer 106 is formed on the interlayer 104, the micro-lens structure 108 may be formed on the passivation layer 106 in accordance with some embodiments. Specifically, the material layer for forming the micro-lens structure 108 may be formed on the passivation layer 106 and the material layer may be patterned by one or more photolithography processes and etching processes (e.g., as shown in FIG. 13C and FIG. 13D) in accordance with some embodiments.

Figure 13C:
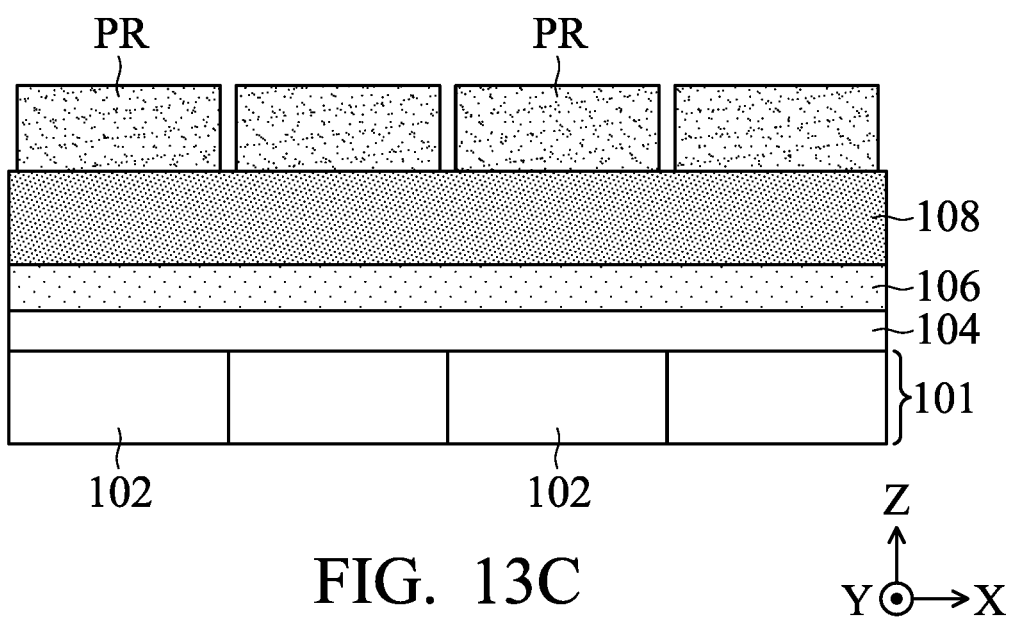
Figure 13D:
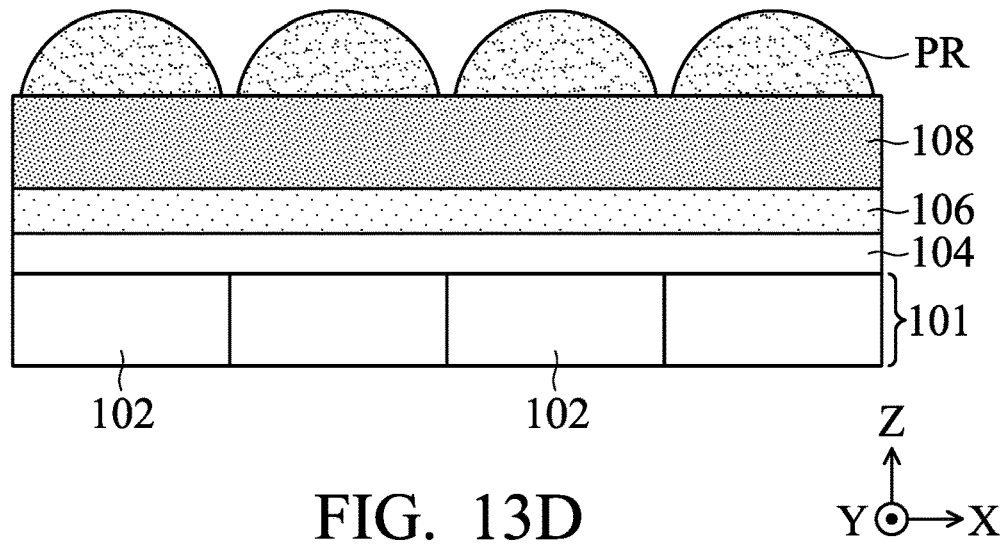

Referring to FIG. 13C, a photoresist PR may be formed on the material layer for forming the micro-lens structure 108 in accordance with some embodiments. In some embodiments, the photoresist PR may be patterned to define the profile of the micro-lens structure 108 that is formed later.

In some embodiments, the photoresist PR may be formed by a spin coating process, a printing process, any other applicable method, or a combination thereof. In addition, one or more photolithography processes and etching processes may be used to pattern the photoresist PR. In some embodiments, the photolithography process may include soft baking, hard baking, mask aligning, exposure, post-exposure baking, developing the photoresist, rinsing, drying, or other suitable processes. In some embodiments, the etching process may include a dry etching process, a wet etching process or a combination thereof. For example, the dry etching process may include reactive ion etch (RIE) process, plasma etch process and so on.

In some embodiments, the micro-lens structure 108 may be directly formed by a reflow process. In some embodiments, the material of the micro-lens structure 108 may include photoresist, which may serve as a sacrificial layer for functional surface coating (e.g., self-assembly monolayers (SAMs)) and the functional surface coating may be located only at the bottom of the opening 108p. In such a configuration, the material within the first reflecting layer 110 may be homogenous.

Next, referring to FIG. 13D, a reflow process may be performed on the photoresist PR to define the profile of the micro-lens structure 108 in accordance with some embodiments. In some embodiments, the reflow process may be performed in a reaction chamber or a hotplate having a suitable temperature. In some embodiments, after the reflow process is performed, the material layer for forming the micro-lens structure 108 may be etched back to transfer the profile of the photoresist PR to the material layer, and the micro-lens structure 108 having the desired profile may be formed.

Figure 13E:
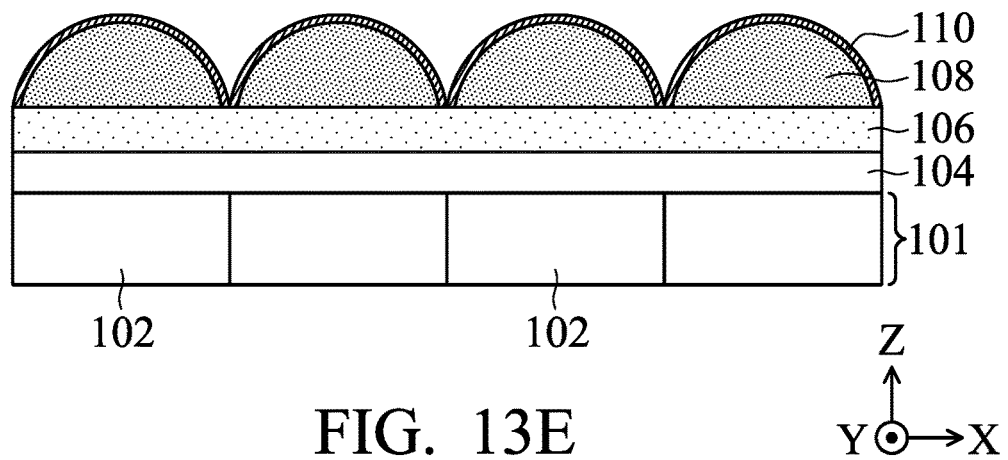

Next, referring to FIG. 13E, the first reflecting layer 110 may be conformally formed on the micro-lens structure 108 in accordance with some embodiments. In some embodiments, the first reflecting layer 110 may partially or entirely cover the micro-lens structure 108.

In some embodiments, the first reflecting layer 110 may be formed by a chemical vapor deposition (CVD) process, a physical vapor deposition (PVD) process, a spin coating process, a printing process, any other applicable method, or a combination thereof.

Figure 13F:
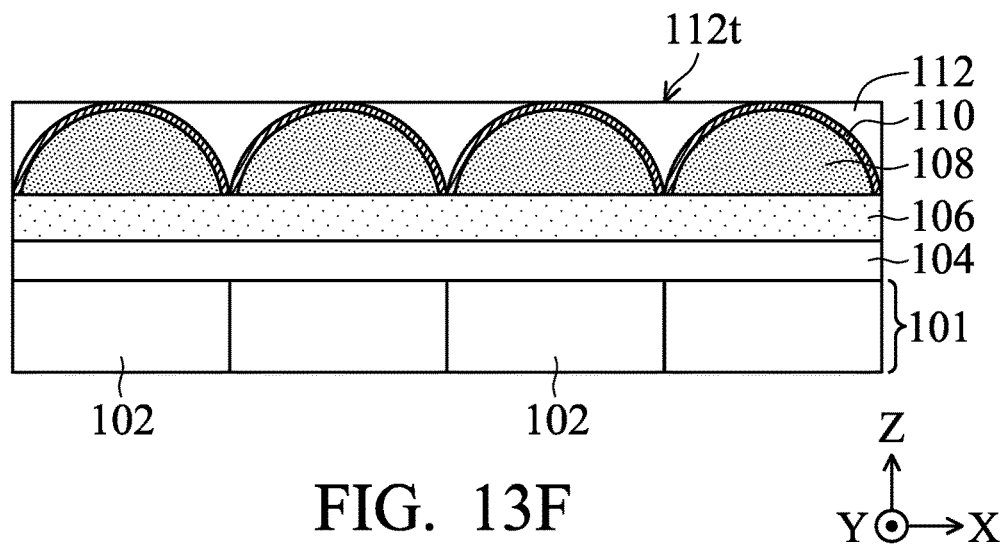

Next, referring to FIG. 13F, after the first reflecting layer 110 is formed, the planarization layer 112 may be formed on the first reflecting layer 110 in accordance with some embodiments. The planarization layer 112 may provide the planar top surface 112t over the first reflecting layer 110 and the micro-lens structure 108.

More specifically, in some embodiments, the material of the planarization layer 112 may be conformally formed on the first reflecting layer 110 and a planarization process may be performed on the material to form the planarization layer 112 having the planar top surface 112t.

In some embodiments, the planarization layer 112 may be formed by a chemical vapor deposition (CVD) process, a physical vapor deposition (PVD) process, a spin coating process, a printing process, any other applicable method, or a combination thereof. In some embodiments, the planarization process may include a chemical mechanical polishing (CMP) process, a mechanical polishing process, a grinding process, an etching process, or a combination thereof.

In addition, in accordance with some embodiments, after the planarization layer 112 is formed on the first reflecting layer 110, the surface modification layer 114 (not illustrated) may be formed on the planarization layer 112.

Figure 13G:
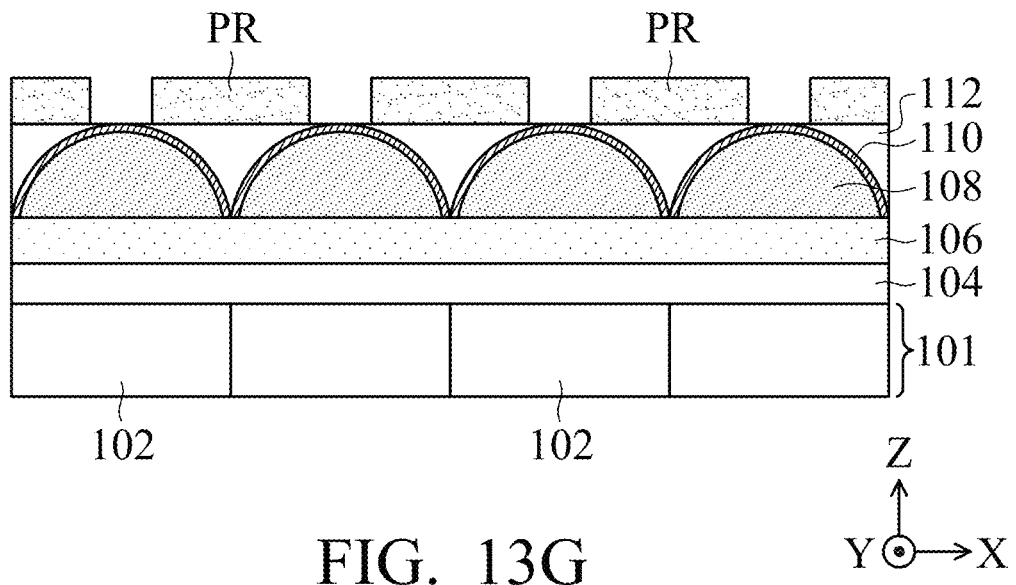

Next, referring to FIG. 13G, a photoresist PR may be formed on the planarization layer 112 in accordance with some embodiments. Specifically, the photoresist PR may be patterned to define the position of the opening 108p that is formed later.

In some embodiments, the photoresist PR may be formed by a chemical vapor deposition (CVD) process, a spin coating process, a printing process, any other applicable method, or a combination thereof. In addition, one or more photolithography processes and etching processes may be used to pattern the photoresist PR.

Figure 13H:
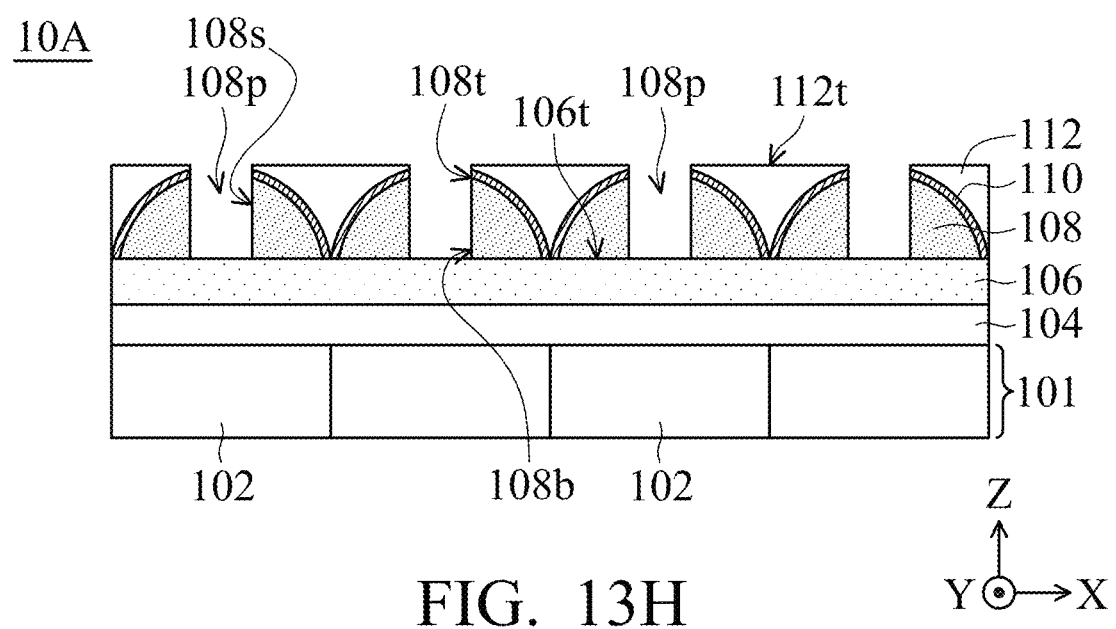

Next, referring to FIG. 13H, a portion of the first reflecting layer 110 and a portion of the micro-lens structure 108 are removed to form the opening 108p in the micro-lens structure 108 in accordance with some embodiments. The opening 108p may expose a portion of the top surface 106t of the passivation layer 106. As shown in FIG. 13H, in some embodiments, the first reflecting layer 110 may extend from the opening 108p to the passivation layer 106.

In some embodiments, one or more photolithography processes and etching processes are used to partially remove the first reflecting layer 110 and the micro-lens structure 108. In some embodiments, the photolithography process may include photoresist coating (e.g., spin coating), soft baking, hard baking, mask aligning, exposure, post-exposure baking, developing the photoresist, rinsing, drying, or other suitable processes. In some embodiments, the etching process may include dry etching process, wet etching process or a combination thereof.

Next, referring to FIGS. 14A-14H, FIGS. 14A-14H are cross-sectional diagrams of the sensor device 10E in various stages of the process for manufacturing the sensor device in accordance with some embodiments of the present disclosure. The process in the embodiments shown in FIGS. 14A-14H is similar to the process in the embodiments shown in FIGS. 13A-13H. The difference between them is that the method for forming the sensor device 10E illustrated in FIGS. 14A-14H further includes forming the second reflecting layer 210 on the interlayer 104 before forming the passivation layer 106.

Figure 14A:
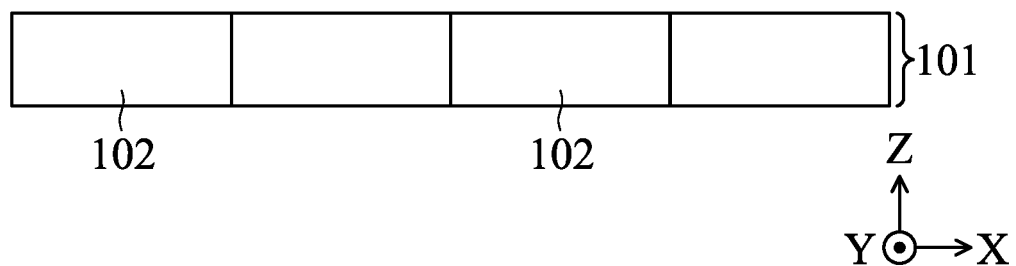
FIGS. 14A-14H are cross-sectional diagrams of a sensor device in various stages of the manufacturing process in accordance with some embodiments of the present disclosure.
Figure 14B:
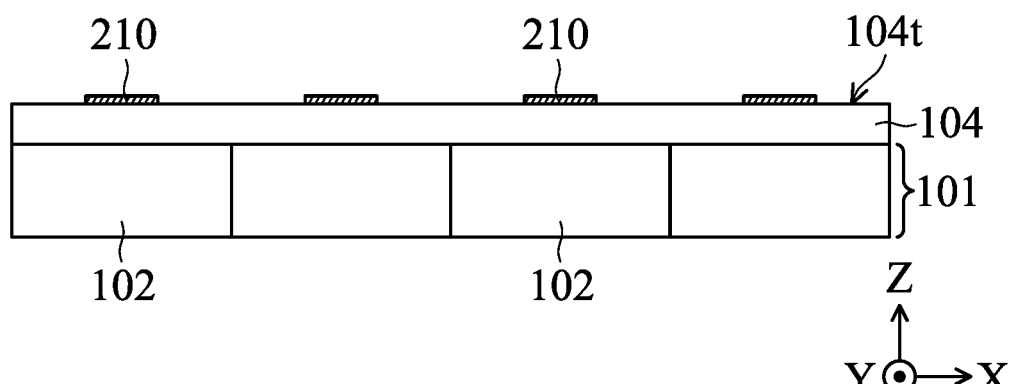

Specifically, in accordance with some embodiments, the method for forming the sensor device 10E may include the following steps. Referring to FIG. 14A, the substrate 101 is provided, and the substrate 101 may include at least one sensor element 102 disposed therein. Referring to FIG. 14B, the interlayer 104 is formed on the substrate 101 and the sensor element 102. In addition, the second reflecting layer 210 is formed on the interlayer 104. Specifically, in some embodiments, the second reflecting layer 210 may be formed on the top surface 104t of the interlayer 104. However, in some other embodiments, the second reflecting layer 210 may be formed at any position between the top surface 106t of the passivation layer 106 and the top surface 104t of the interlayer 104.

In some embodiments, the second reflecting layer 210 may be formed by a chemical vapor deposition (CVD) process, a physical vapor deposition (PVD) process, a spin coating process, a printing process, any other applicable method, or a combination thereof. In some embodiments, the second reflecting layer 210 may be patterned by one or more photolithography processes and etching processes.

Figure 14C:
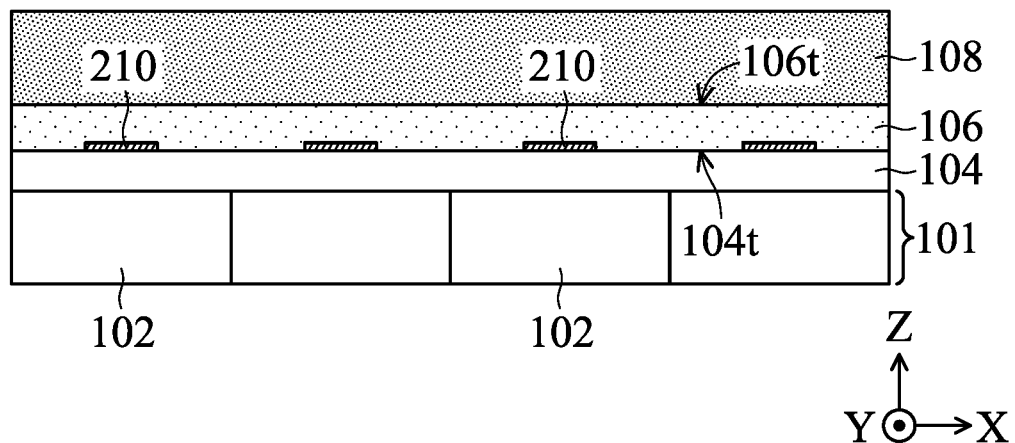
Figure 14D:
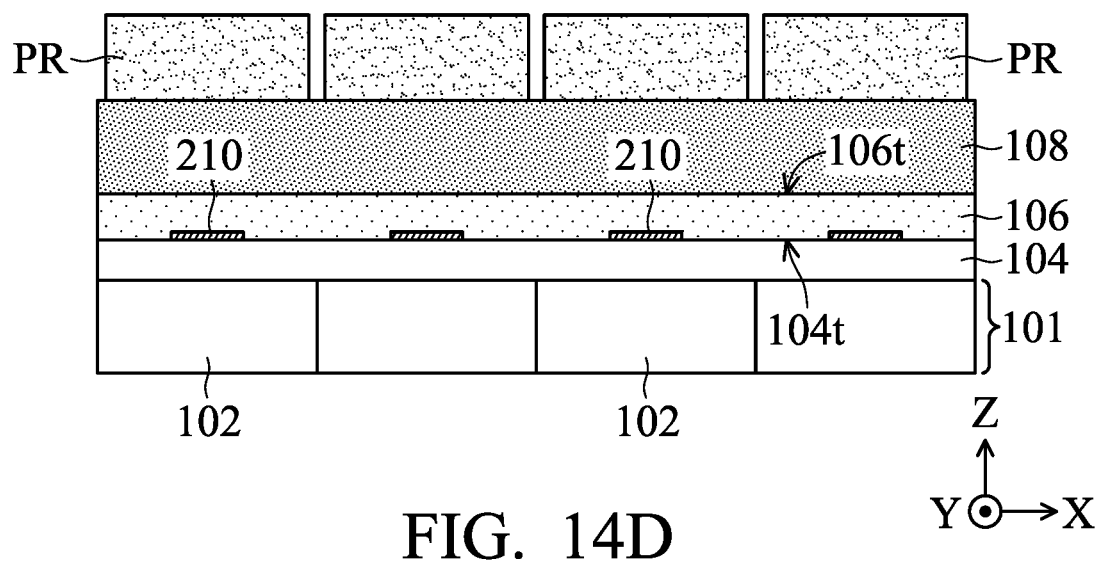

In addition, referring to FIG. 14C, after the second reflecting layer 210 is formed on the interlayer 104, the material layer for forming the micro-lens structure 108 is formed on the passivation layer 106. Next, referring to FIG.

Figure 14E:
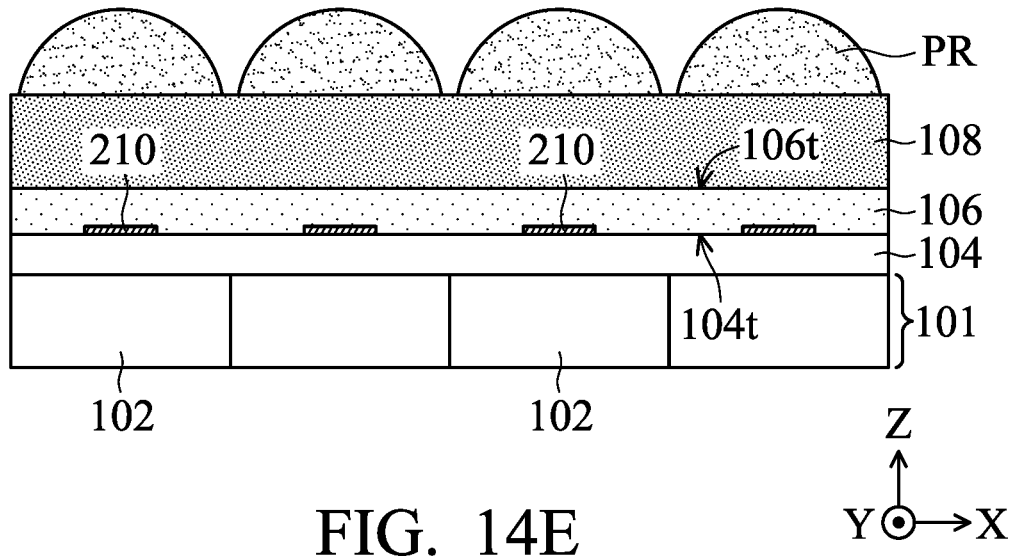
Figure 14F:
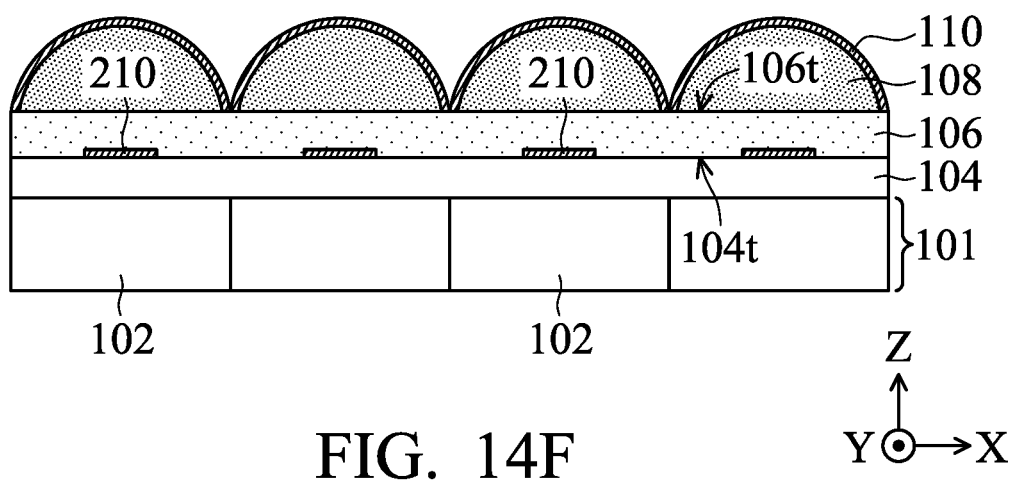
Figure 14G:
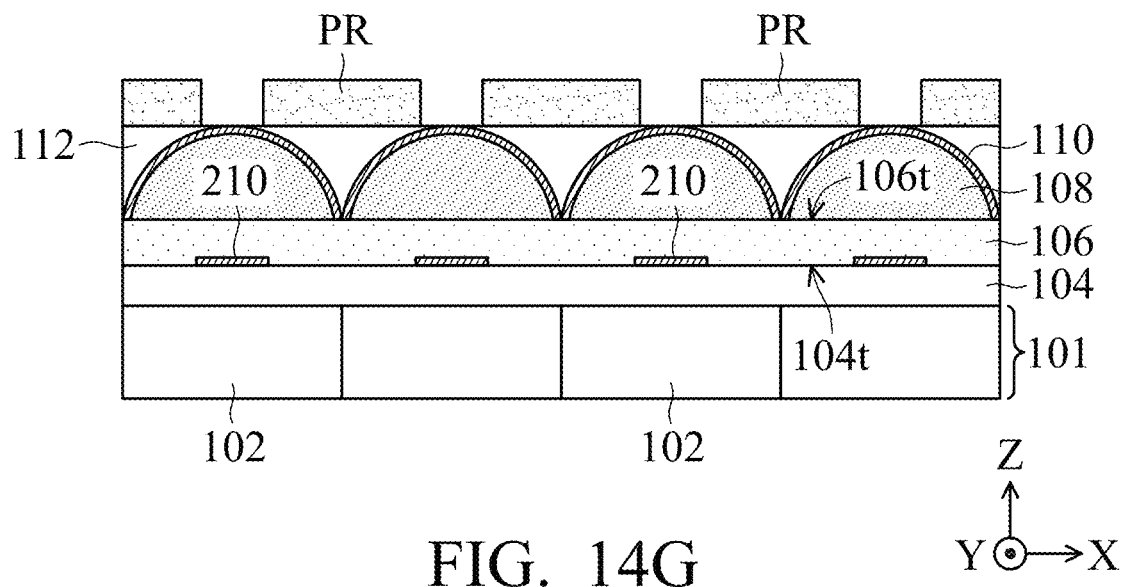
Figure 14H:
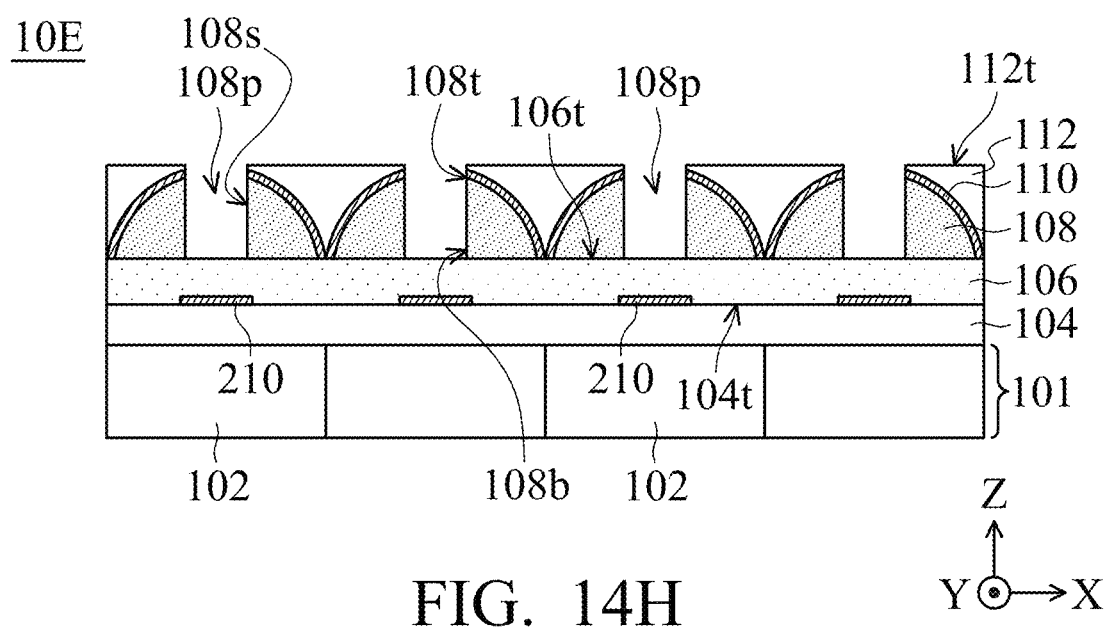

14D, a patterned photoresist PR is formed on the material layer for forming the micro-lens structure 108. Referring to FIG. 14E, a reflow process is performed on the photoresist PR to define the profile of the micro-lens structure 108. Referring to FIG. 14F, the first reflecting layer 110 is conformally formed on the micro-lens structure 108. Referring to FIG. 14G, after the first reflecting layer 110 is formed, the planarization layer 112 is formed on the first reflecting layer 110 and a patterned photoresist PR is formed on the planarization layer 112. Next, referring to FIG. 14H, a portion of the first reflecting layer 110 and a portion of the micro-lens structure 108 are removed to form the opening 108p in the micro-lens structure 108.

Next, referring to FIGS. 15A-15H, FIGS. 15A-15H are cross-sectional diagrams of the sensor device 10F in various stages of the process for manufacturing the sensor device in accordance with some embodiments of the present disclosure. The process in the embodiments shown in FIGS. 15A-15H is similar to the process in the embodiments shown in FIGS. 14A-14H. The difference between them is that the method for forming the sensor device 10F illustrated in FIGS. 15A-15H further includes forming the waveguide structure 310 on or embedded in the passivation layer 106 before forming the micro-lens structure 108.

Figure 15A:
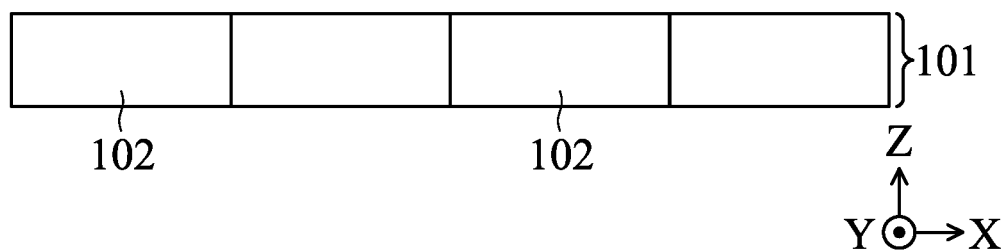
FIGS. 15A-15H are cross-sectional diagrams of a sensor device in various stages of the manufacturing process in accordance with some embodiments of the present disclosure.
Figure 15B:
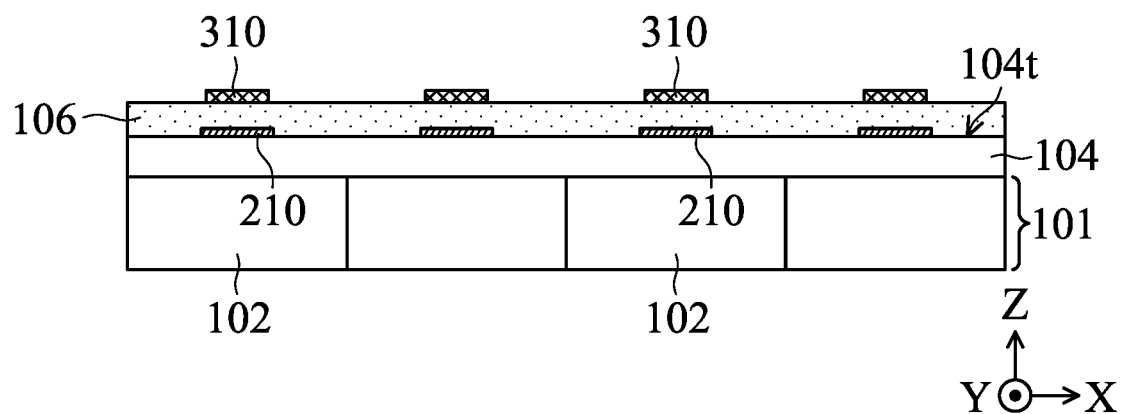

Specifically, in accordance with some embodiments, the method for forming the sensor device 10F may include the following steps. Referring to FIG. 15A, the substrate 101 is provided, and the substrate 101 may include at least one sensor element 102 disposed therein. Referring to FIG. 15B, the interlayer 104 is formed on the substrate 101 and the sensor element 102. In addition, the second reflecting layer 210 is formed on the interlayer 104, and the passivation layer 106 is formed on the second reflecting layer 210.

After the passivation layer 106 is formed on the second reflecting layer 210, the waveguide structure 310 may be formed on the passivation layer 106. In some embodiments, the waveguide structure 310 may be formed by a chemical vapor deposition (CVD) process, a physical vapor deposition (PVD) process, a spin coating process, a printing process, any other applicable method, or a combination thereof.

Figure 15C:
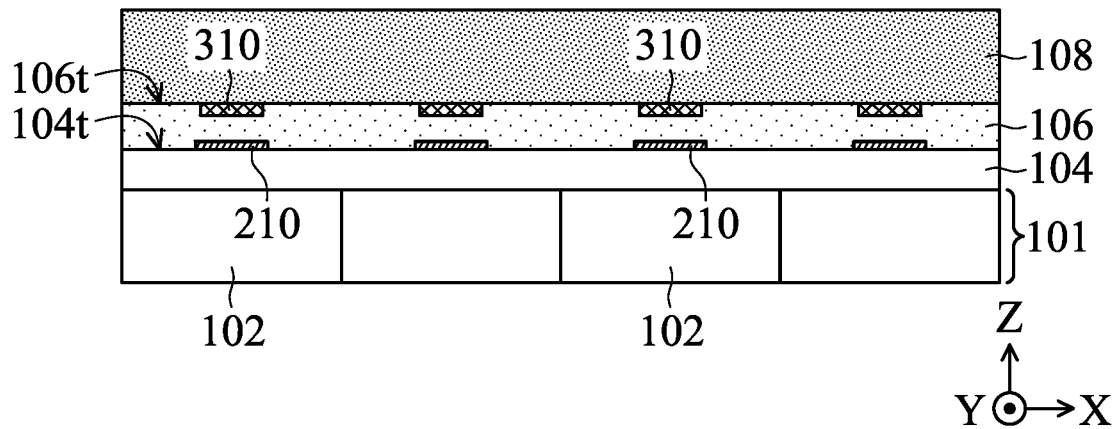

Referring to FIG. 15C, in accordance with some embodiments, after the waveguide structure 310 is formed, the passivation layer 106 may be optionally formed to cover the waveguide structure 310 and then a portion of the passivation layer 106 may be removed to expose the top surface of the waveguide structure 310, and then the material layer for forming the micro-lens structure 108 is formed on the waveguide structure 310 and the passivation layer 106. In some other embodiments, after the waveguide structure 310 is formed, the material layer for forming the micro-lens structure 108 may be directly formed on the waveguide structure 310 and the passivation layer 106.

Figure 15D:
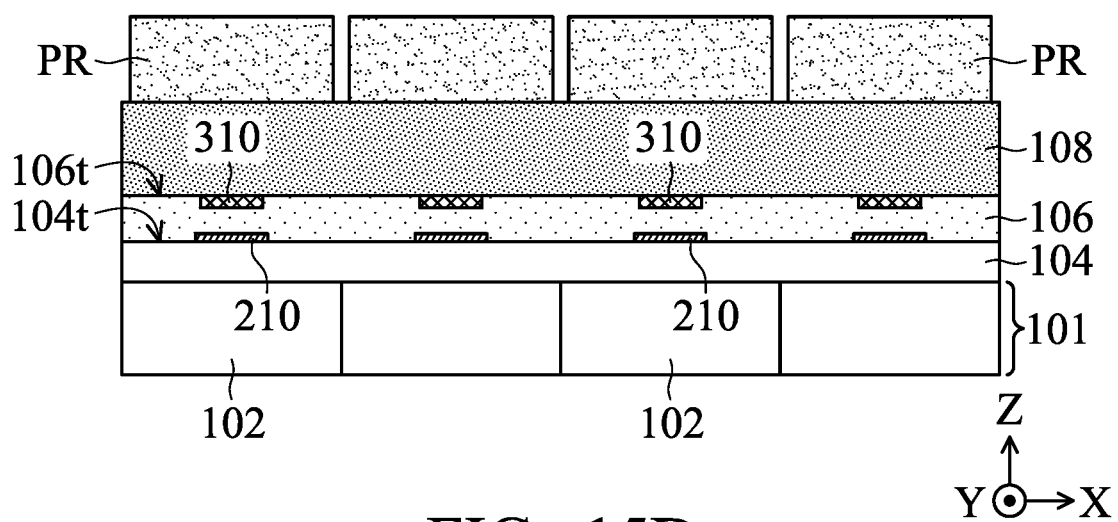
Figure 15E:
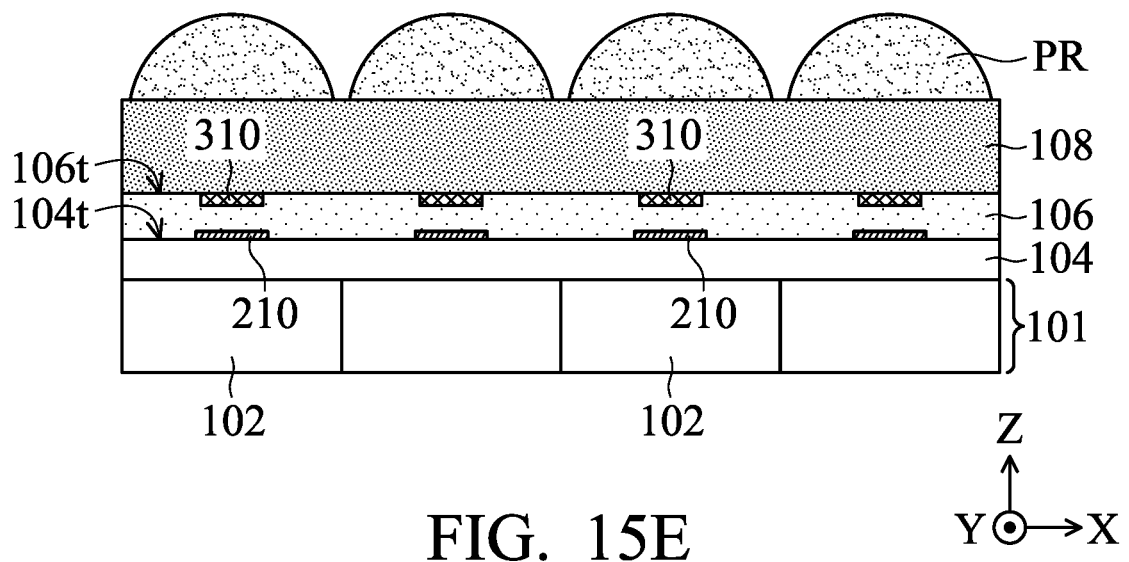
Figure 15F:
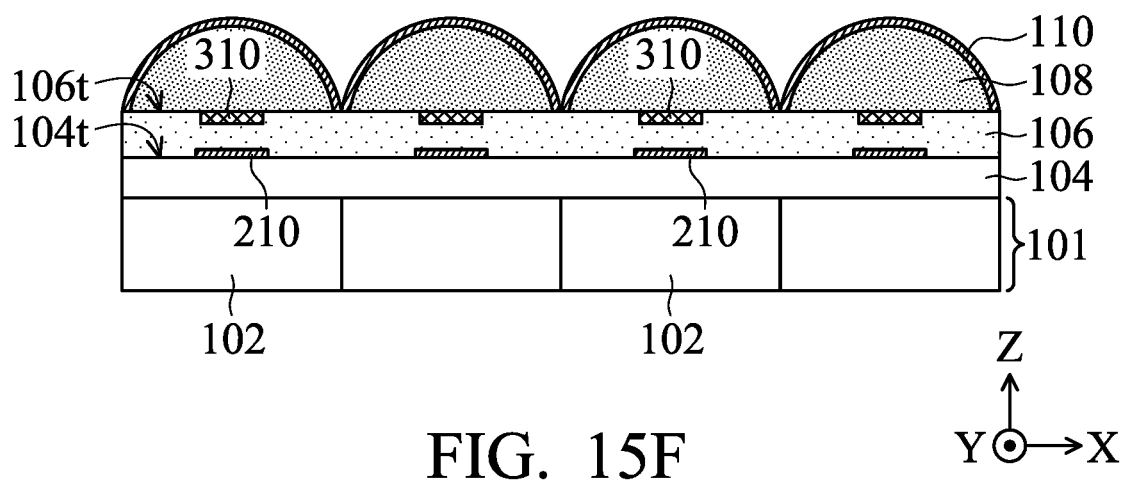
Figure 15G:
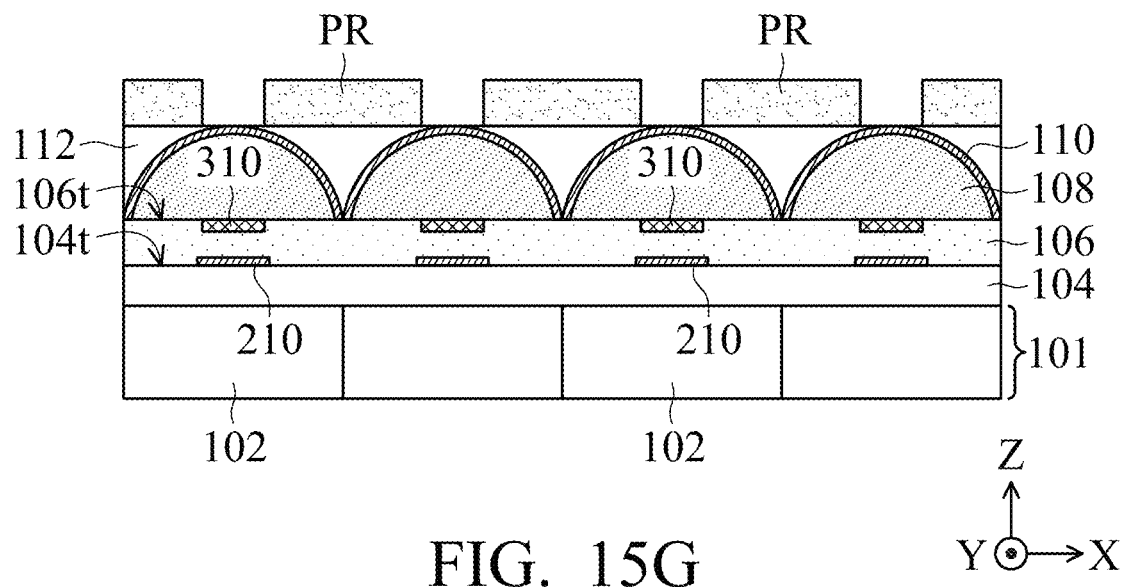
Figure 15H:
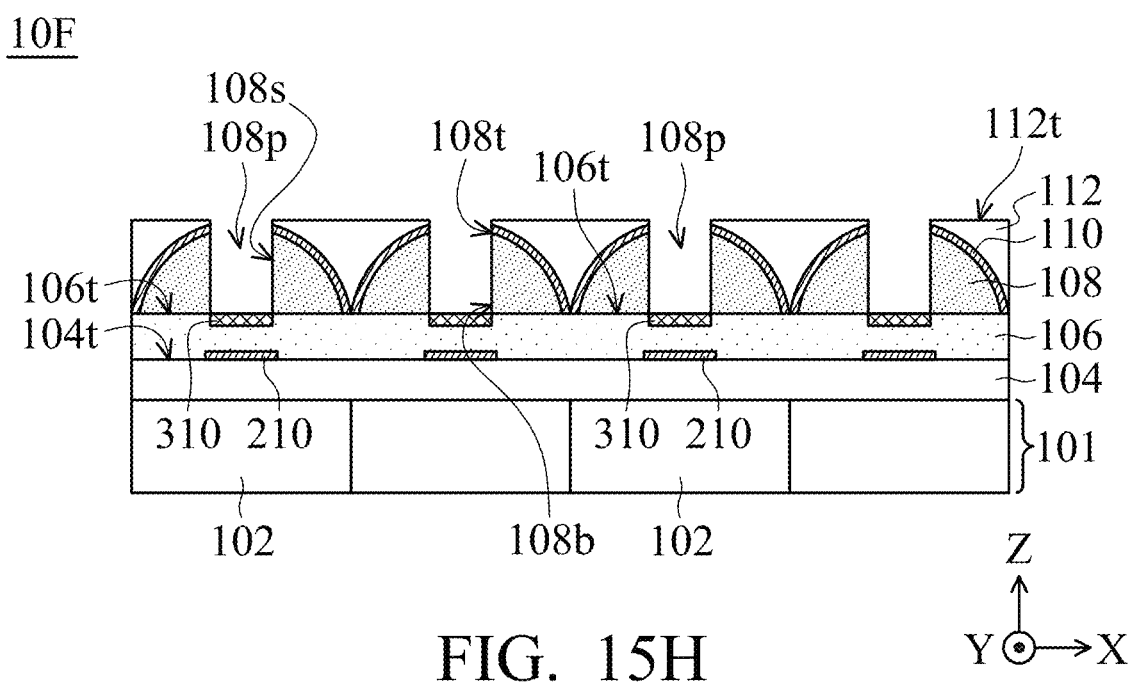

Thereafter, referring to FIG. 15D, a patterned photoresist PR is formed on the material layer for forming the micro-lens structure 108. Referring to FIG. 15E, a reflow process is performed on the photoresist PR to define the profile of the micro-lens structure 108. Referring to FIG. 15F, the first reflecting layer 110 is conformally formed on the micro-lens structure 108. Referring to FIG. 15G, after the first reflecting layer 110 is formed, the planarization layer 112 is formed on the first reflecting layer 110 and a patterned photoresist PR is formed on the planarization layer 112. Next, referring to FIG. 15H, a portion of the first reflecting layer 110 and a portion of the micro-lens structure 108 are removed to form the opening 108p in the micro-lens structure 108. In addition, the opening 108p may expose the waveguide structure 310 in accordance with some embodiments.

Next, referring to FIGS. 16A-16H, FIGS. 16A-16H are cross-sectional diagrams of the sensor device 10G in various stages of the process for manufacturing the sensor device in accordance with some embodiments of the present disclosure. The process in the embodiments shown in FIGS. 16A-16H is similar to the process in the embodiments shown in FIGS. 15A-15H. The difference between them is that the method for forming the sensor device 10G illustrated in FIGS. 16A-16H further includes patterning the second reflecting layer 210 to form the aperture 210p within the second reflecting layer 210.

Figure 16A:
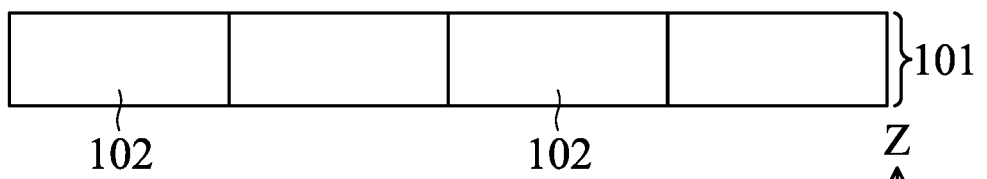
FIGS. 16A-16H are cross-sectional diagrams of a sensor device in various stages of the manufacturing process in accordance with some embodiments of the present disclosure.
Figure 16B:
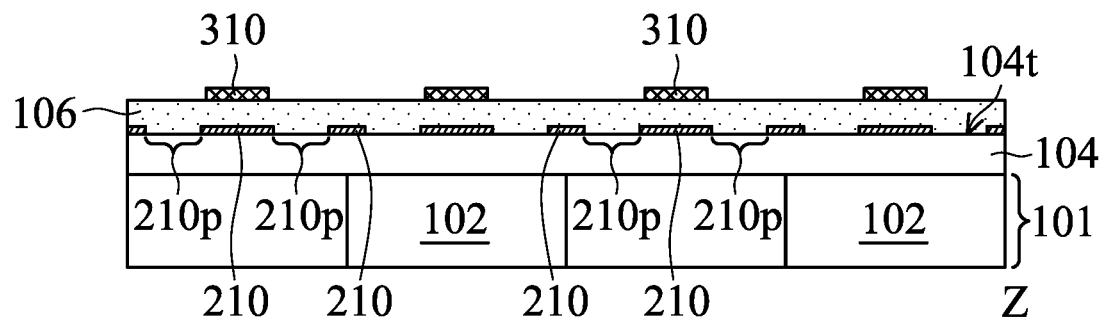
Figure 16C:
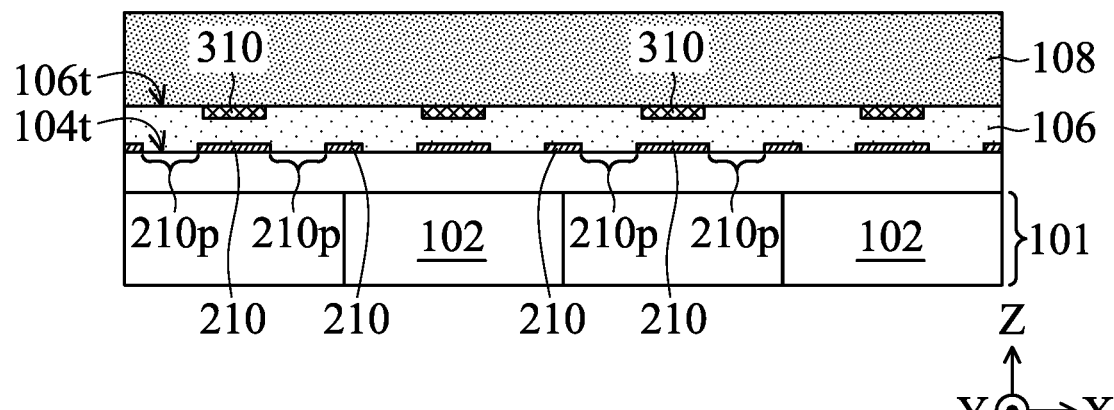

Specifically, in accordance with some embodiments, the method for forming the sensor device 10G may include the following steps. Referring to FIG. 16A, the substrate 101 is provided, and the substrate 101 may include at least one sensor element 102 disposed therein. Referring to FIG. 16B, the interlayer 104 is formed on the substrate 101 and the sensor element 102. In addition, the second reflecting layer 210 is formed on the interlayer 104, and the passivation layer 106 is formed on the second reflecting layer 210.

Specifically, before the passivation layer 106 is formed, the second reflecting layer 210 may be patterned to form the aperture 210p within the second reflecting layer 210. In some embodiments, the second reflecting layer 210 may be patterned by one or more photolithography processes and etching processes to form the aperture 210p.

In addition, after the passivation layer 106 is formed on the second reflecting layer 210, the waveguide structure 310 may be formed on the passivation layer 106. Next, referring to FIG. 16C, the material layer for forming the micro-lens structure 108 may be formed on the waveguide structure 310 and the passivation layer 106.

Figure 16D:
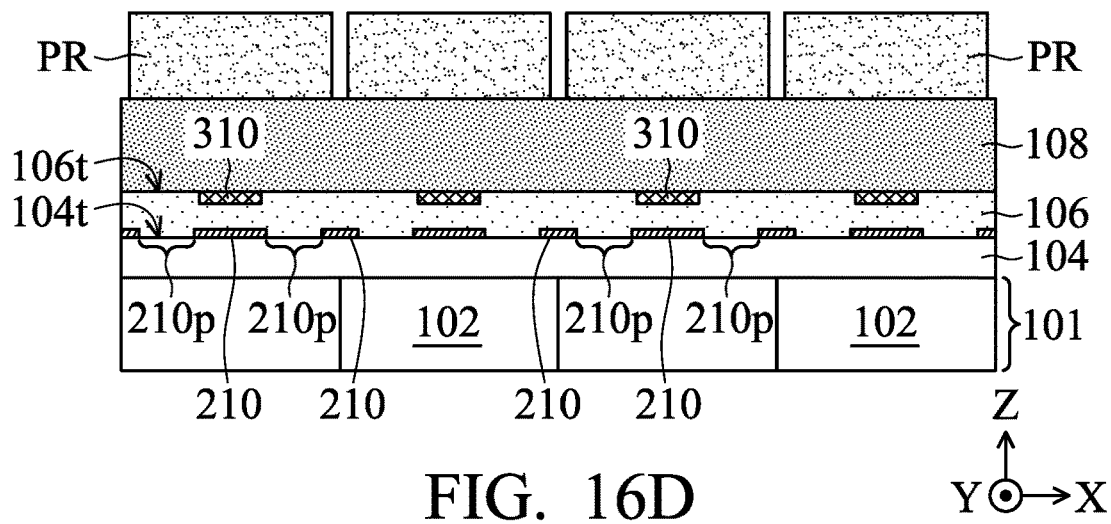
Figure 16E:
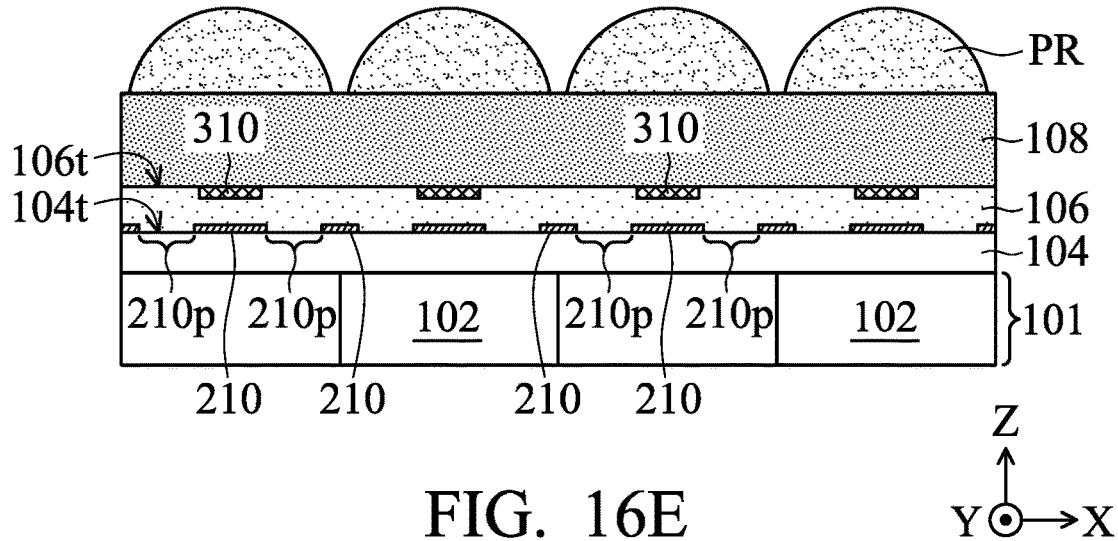
Figure 16F:
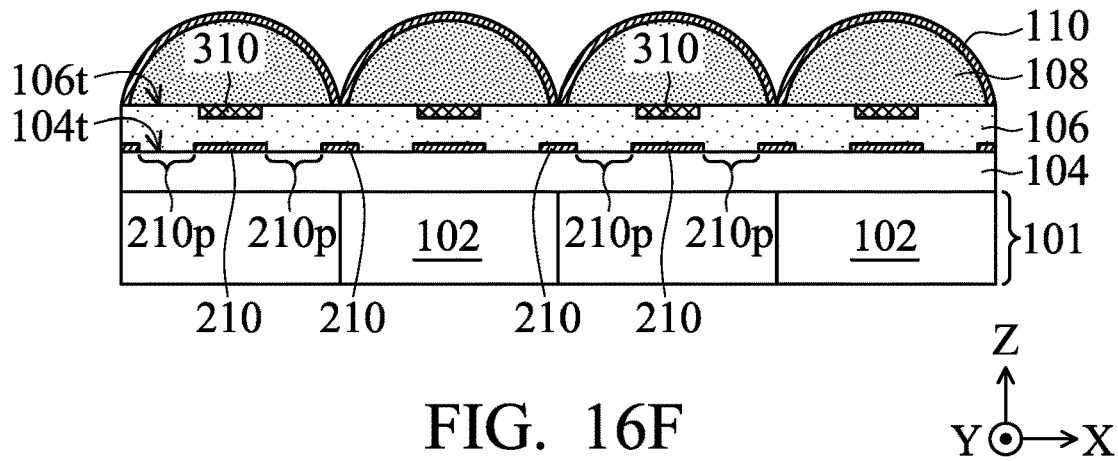
Figure 16G:
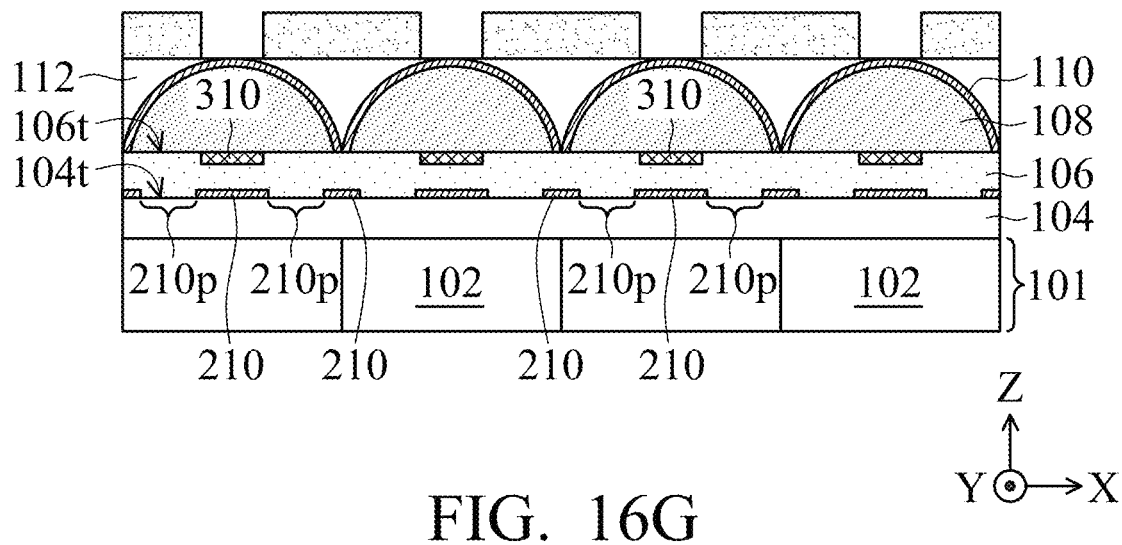
Figure 16H:
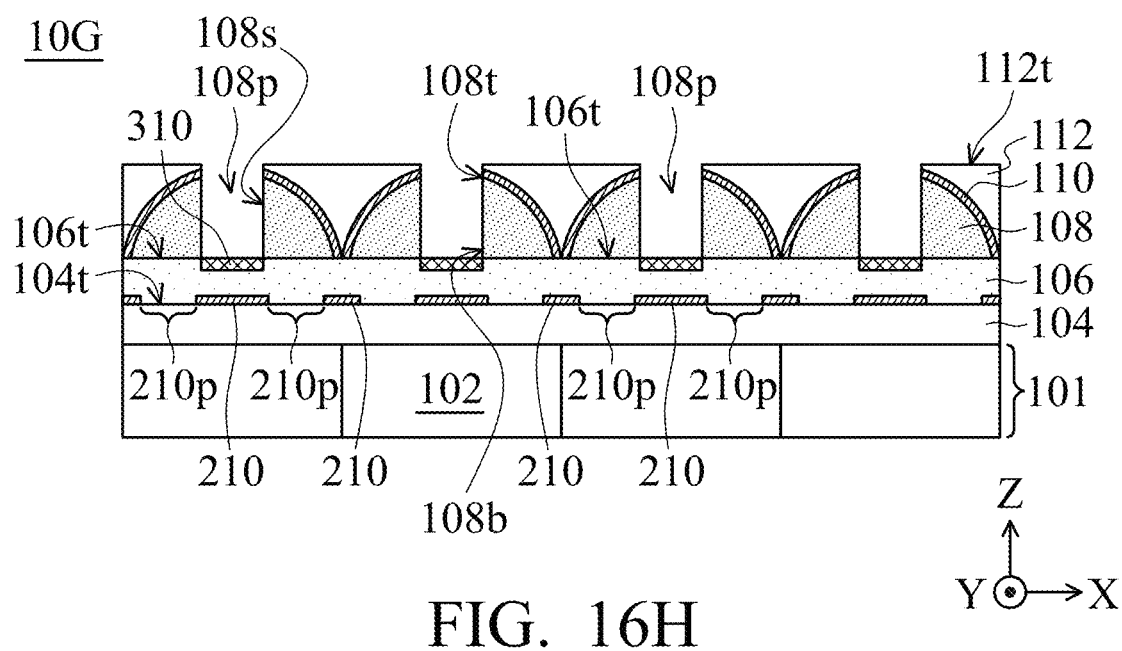

Thereafter, referring to FIG. 16D, a patterned photoresist PR is formed on the material layer for forming the micro-lens structure 108. Referring to FIG. 16E, a reflow process is performed on the photoresist PR to define the profile of the micro-lens structure 108. Referring to FIG. 16F, the first reflecting layer 110 is conformally formed on the micro-lens structure 108. Referring to FIG. 16G, after the first reflecting layer 110 is formed, the planarization layer 112 is formed on the first reflecting layer 110 and a patterned photoresist PR is formed on the planarization layer 112. Next, referring to FIG. 16H, a portion of the first reflecting layer 110 and a portion of the micro-lens structure 108 are removed to form the opening 108p in the micro-lens structure 108.

To summarize the above, in accordance with some embodiments of the present disclosure, the sensor device may include a reflecting layer that is disposed above the micro-lens structure. The reflecting layer may reflect the light that is emitted in the opposite direction from the photodiode and therefore may increase the emission light collection efficiency of the photodiode. Accordingly, the sensitivity and performance of the sensor device may be improved.

Although some embodiments of the present disclosure and their advantages have been described in detail, it should be understood that various changes, substitutions and alterations can be made herein without departing from the spirit and scope of the disclosure as defined by the appended claims. For example, it will be readily understood by one of ordinary skill in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A sensor device, comprising:
   at least one sensor unit, comprising:
   at least one sensor element;
   an interlayer disposed on the at least one sensor element;
   a passivation layer disposed on the interlayer;
   a micro-lens structure disposed on the passivation layer;
   an opening disposed in the micro-lens structure; and
   a first reflecting layer disposed on the micro-lens structure,
   wherein the first reflecting layer extends from the opening to the passivation layer, wherein the micro-lens structure is in contact with the passivation layer.

2. The sensor device as claimed in claim 1, wherein the first reflecting layer extends from a sidewall of the opening to a top surface of the passivation layer.

3. The sensor device as claimed in claim 1, wherein a material of the first reflecting layer has a property of high reflection for emission light.

4. The sensor device as claimed in claim 1, wherein in a cross-sectional view, the micro-lens structure has a shape of a semi-circle, semi-ellipse, triangle, rectangle, or another shape that can reflect light toward the at least one sensor element.

5. The sensor device as claimed in claim 1, wherein the micro-lens structure has a parallel light or a single focus point corresponding to one sensor element, two focus points corresponding to two sensor elements, or a plurality of focus points corresponding to three or four sensor elements.

6. The sensor device as claimed in claim 1, wherein the at least one sensor unit further comprises a second reflecting layer disposed between the interlayer and the micro-lens structure.

7. The sensor device as claimed in claim 6, wherein the opening overlaps the second reflecting layer.

8. The sensor device as claimed in claim 6, wherein a material of the second reflecting layer has a property of high reflection for excitation light.

9. The sensor device as claimed in claim 6, wherein the at least one sensor unit further comprises a waveguide structure disposed above the second reflecting layer.

10. The sensor device as claimed in claim 9, wherein the opening overlaps the waveguide structure.

11. The sensor device as claimed in claim 1, wherein the interlayer comprises a filter, a passivation material, a metal layer, or a combination thereof.

12. The sensor device as claimed in claim 11, wherein the filter is surrounded by the metal layer.

13. The sensor device as claimed in claim 11, wherein the filter comprises a uniform filter, a pixelated filter, a rejection filter, or a combination thereof.

14. The sensor device as claimed in claim 1, wherein the opening comprises a reaction region, and the reaction region corresponds to at least one sensor element.

15. The sensor device as claimed in claim 14, wherein the reaction region corresponds to one, two, three or four sensor elements.

16. A method for manufacturing a sensor device, comprising:
   providing a substrate comprising at least one sensor element;
   forming an interlayer on the at least one sensor element;
   forming a passivation layer on the interlayer;
   forming a micro-lens structure on the passivation layer;
   conformally forming a first reflecting layer on the micro-lens structure; and
   removing a portion of the first reflecting layer and a portion of the micro-lens structure, and forming an opening in the micro-lens structure,
   wherein the first reflecting layer extends from the opening to the passivation layer, and the micro-lens structure is in contact with the passivation layer after the opening is formed.

17. The method for manufacturing a sensor device as claimed in claim 16, further comprising forming a second reflecting layer on the interlayer before forming the passivation layer.

18. The method for manufacturing a sensor device as claimed in claim 17, further comprising forming a waveguide structure on the passivation layer before forming the micro-lens structure.

19. The method for manufacturing a sensor device as claimed in claim 17, further comprising patterning the second reflecting layer to form an aperture.

20. The method for manufacturing a sensor device as claimed in claim 16, further comprising forming a planarization layer on the first reflecting layer.

* * * * *